US010263238B2

(12) United States Patent
Hwang et al.

(10) Patent No.: US 10,263,238 B2
(45) Date of Patent: Apr. 16, 2019

(54) BATTERY PROTECTION CIRCUIT MODULE PACKAGE, BATTERY PACK AND ELECTRONIC DEVICE INCLUDING SAME

(71) Applicant: ITM SEMICONDUCTOR CO., LTD, Chungcheongbuk-do (KR)

(72) Inventors: Hoseok Hwang, Gyeonggi-do (KR); Youngseok Kim, Chungcheongbuk-do (KR); Sunghee Lee, Gyeonggi-do (KR); Seongbeom Park, Gyeonggi-do (KR); Sanghoon Ahn, Chungcheongbuk-do (KR); Taehwan Jeong, Chungcheongbuk-do (KR); Seunguk Park, Chungcheongnam-do (KR); Jaeku Park, Chungcheongbuk-do (KR); Younggeun Yoon, Chungcheongbuk-do (KR); Hyunsuck Lee, Chungcheongbuk-do (KR); Sunghee Wang, Jeollanam-do (KR)

(73) Assignee: ITM SEMICONDUCTOR CO., LTD., Chungcheongbuk-do (KR)

(*) Notice: Subject to any disclaimer, the term of this patent is extended or adjusted under 35 U.S.C. 154(b) by 384 days.

(21) Appl. No.: 14/898,593

(22) PCT Filed: Jun. 25, 2014

(86) PCT No.: PCT/KR2014/005612
§ 371 (c)(1),
(2) Date: Dec. 15, 2015

(87) PCT Pub. No.: WO2015/002401
PCT Pub. Date: Jan. 8, 2015

(65) Prior Publication Data
US 2016/0141594 A1    May 19, 2016

(30) Foreign Application Priority Data

| Jul. 1, 2013 | (KR) | ................... 10-2013-0076473 |
| Jul. 1, 2013 | (KR) | ................... 10-2013-0076474 |
| Sep. 24, 2013 | (KR) | ................... 10-2013-0113490 |

(51) Int. Cl.
*H01M 2/34* (2006.01)
*H01M 10/42* (2006.01)
(Continued)

(52) U.S. Cl.
CPC ......... *H01M 2/348* (2013.01); *H01M 10/425* (2013.01); *H02H 7/18* (2013.01);
(Continued)

(58) Field of Classification Search
None
See application file for complete search history.

(56) References Cited

U.S. PATENT DOCUMENTS

| 2011/0052941 A1* | 3/2011 | Jang ..................... H01M 2/0404 429/7 |
| 2013/0040170 A1* | 2/2013 | Choi ....................... H01M 2/26 429/7 |
| 2014/0347776 A1* | 11/2014 | Na ........................... H01M 2/34 361/93.7 |

FOREIGN PATENT DOCUMENTS

| CN | 102931373 A | 2/2013 |
| KR | 1020060085874 | 7/2006 |

(Continued)

*Primary Examiner* — Daniel S Gatewood
(74) *Attorney, Agent, or Firm* — Stuart H. Mayer; Mayer & Williams PC

(57) ABSTRACT

Provided are a battery protection circuit module package capable of achieving high integration and size reduction, and a battery pack and an electronic device including the same. The battery protection circuit module package includes a lead frame including a plurality of leads space apart from
(Continued)

each other, and capable of being coupled and electrically connected to electrode tabs of a battery cell, battery protection circuit devices mounted on the lead frame and including a positive temperature coefficient (PTC) structure, and an encapsulant for encapsulating the battery protection circuit devices to expose a part of the lead frame.

11 Claims, 21 Drawing Sheets

(51) Int. Cl.
*H01M 2/02* (2006.01)
*H02H 7/18* (2006.01)
*H01M 10/052* (2010.01)

(52) U.S. Cl.
CPC ............ *H01L 2224/48145* (2013.01); *H01L 2224/49111* (2013.01); *H01L 2924/19105* (2013.01); *H01M 2/021* (2013.01); *H01M 2/0212* (2013.01); *H01M 10/052* (2013.01); *H01M 2200/106* (2013.01); *H01M 2220/30* (2013.01)

(56) References Cited

FOREIGN PATENT DOCUMENTS

| | | | |
|---|---|---|---|
| KR | 100860004 B1 * | 9/2008 | |
| KR | 1020110024251 | 3/2011 | |
| KR | 20110071798 A * | 6/2011 | ............ H01M 10/42 |
| KR | 1020130018097 | 2/2013 | |
| KR | 1020130039143 | 4/2013 | |
| KR | 101266509 | 5/2013 | |
| WO | 2013/055026 A1 | 4/2013 | |
| WO | WO-2013055026 A1 * | 4/2013 | ........ H01M 10/4257 |

* cited by examiner

[FIG. 1]
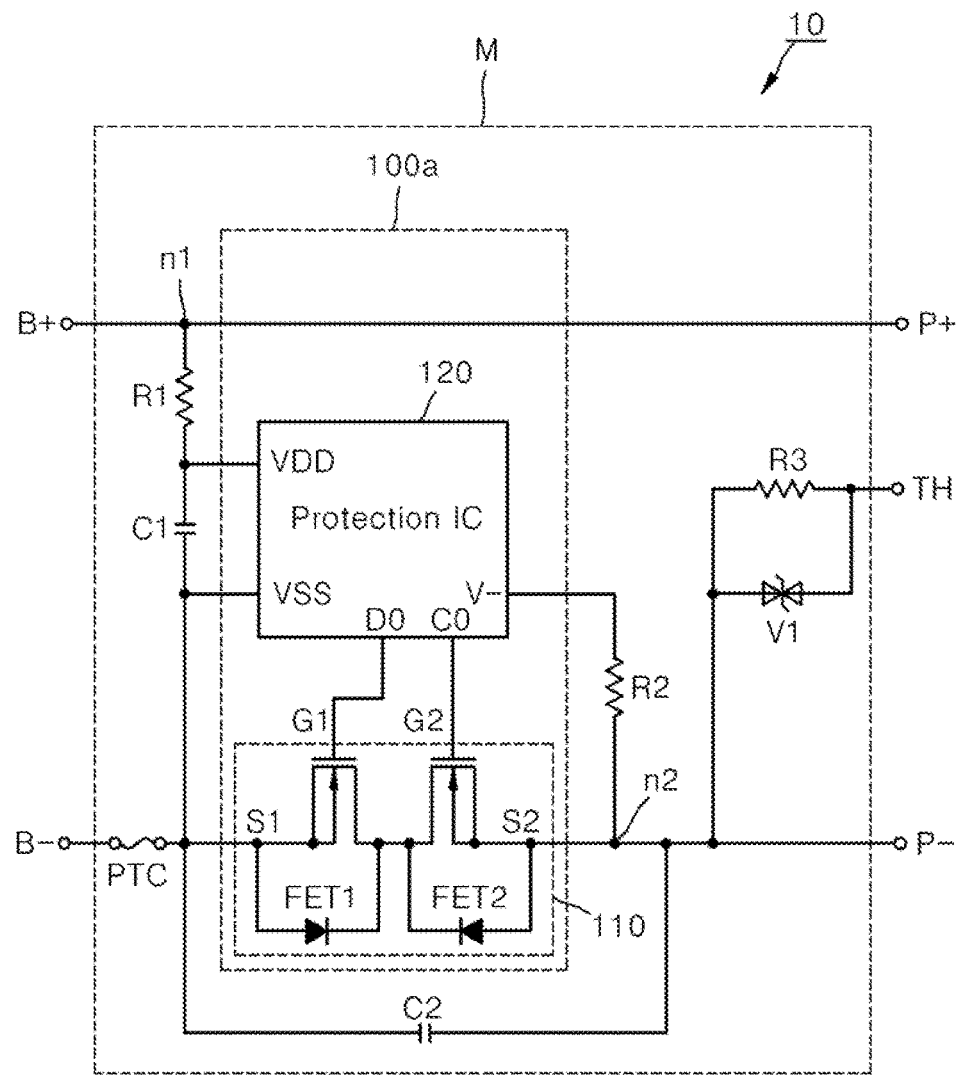

[FIG. 2]
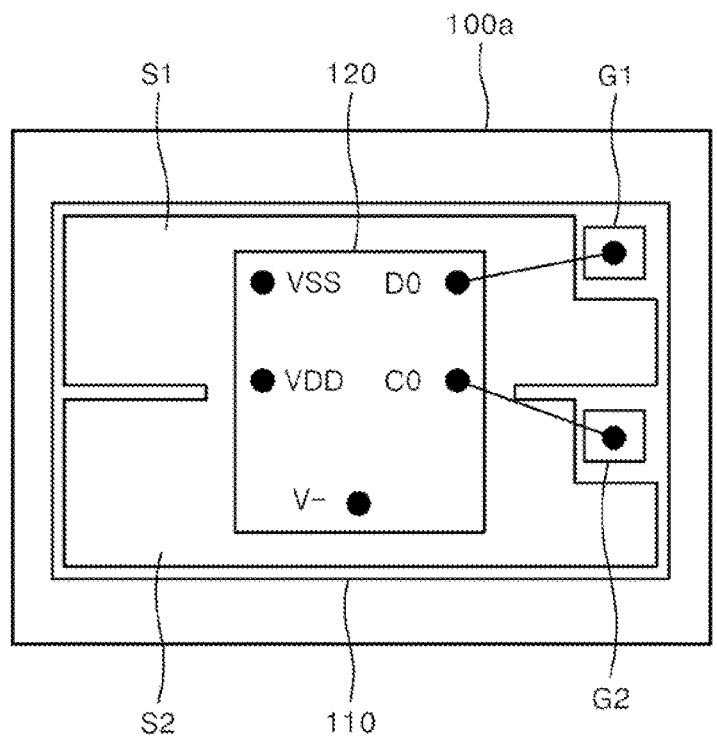
[FIG. 3]
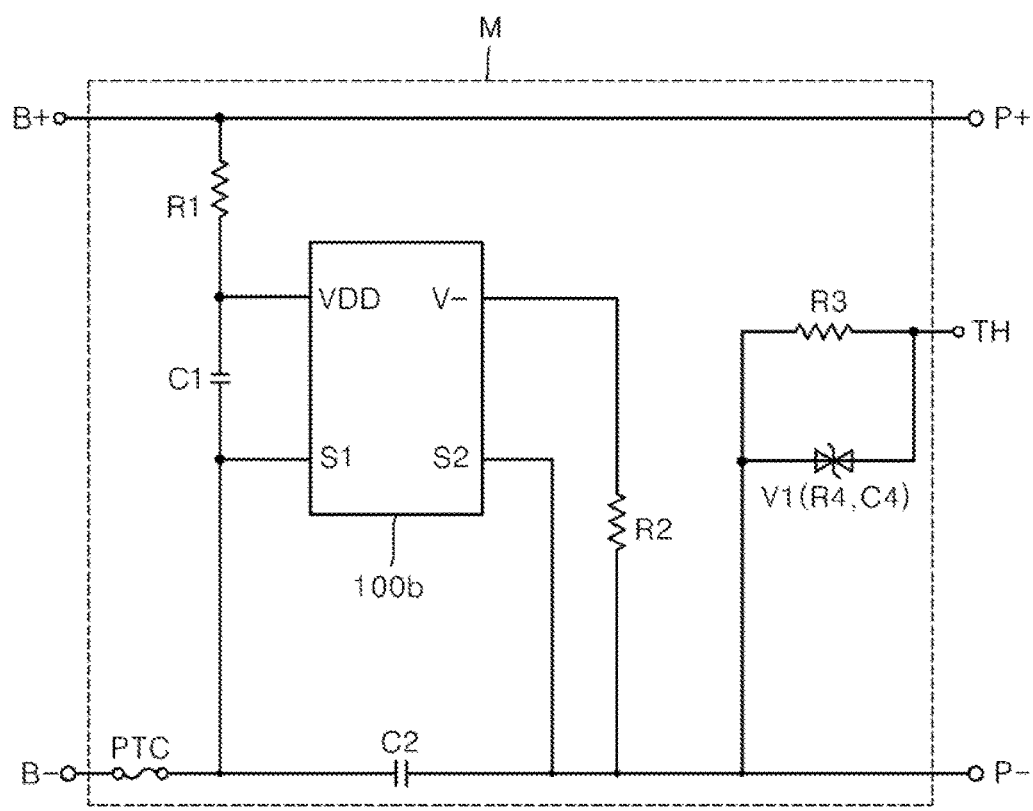

[FIG. 4]
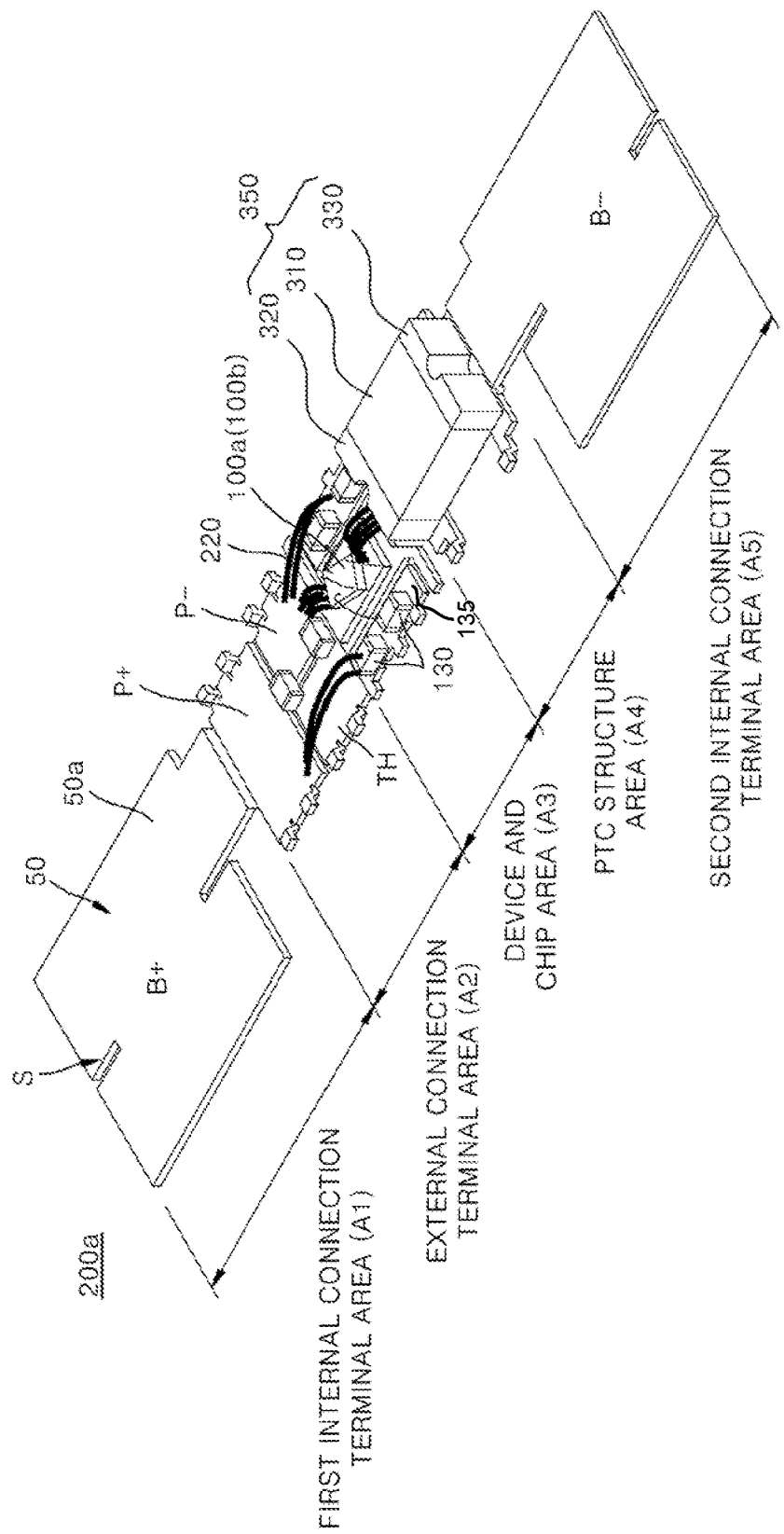

[FIG. 5]
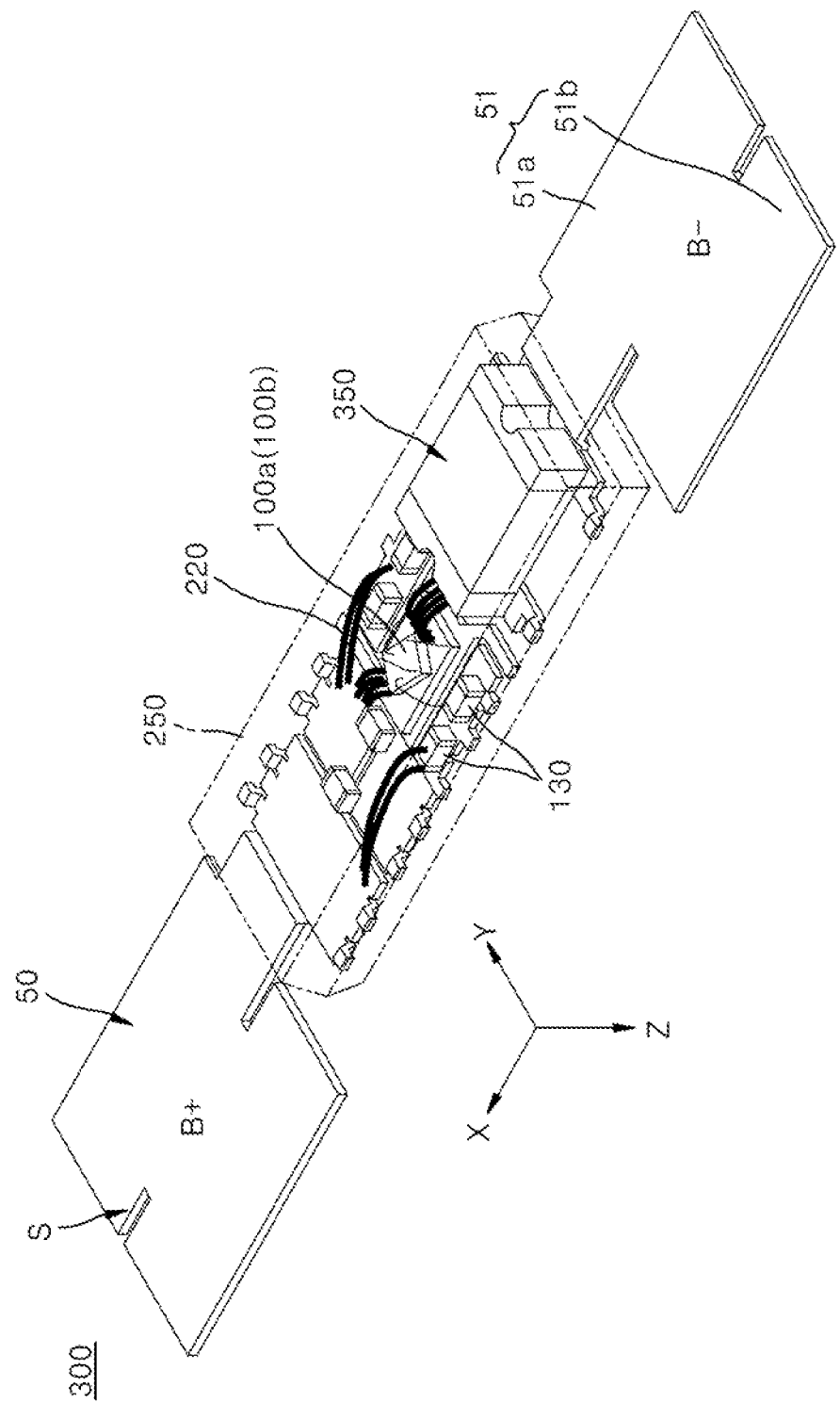

[FIG. 6]
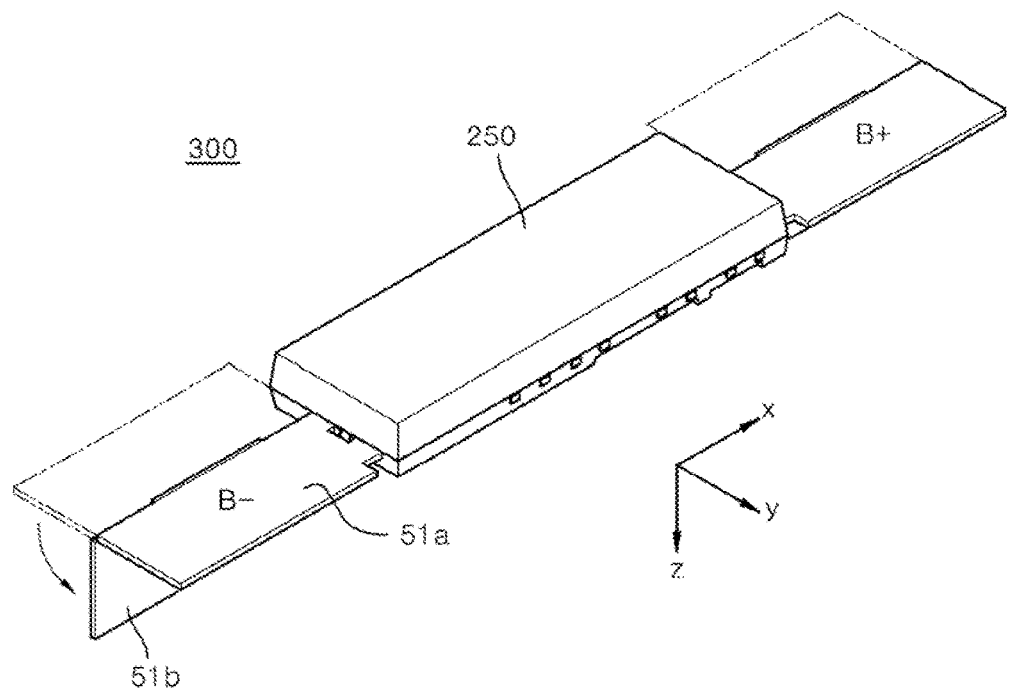
[FIG. 7]
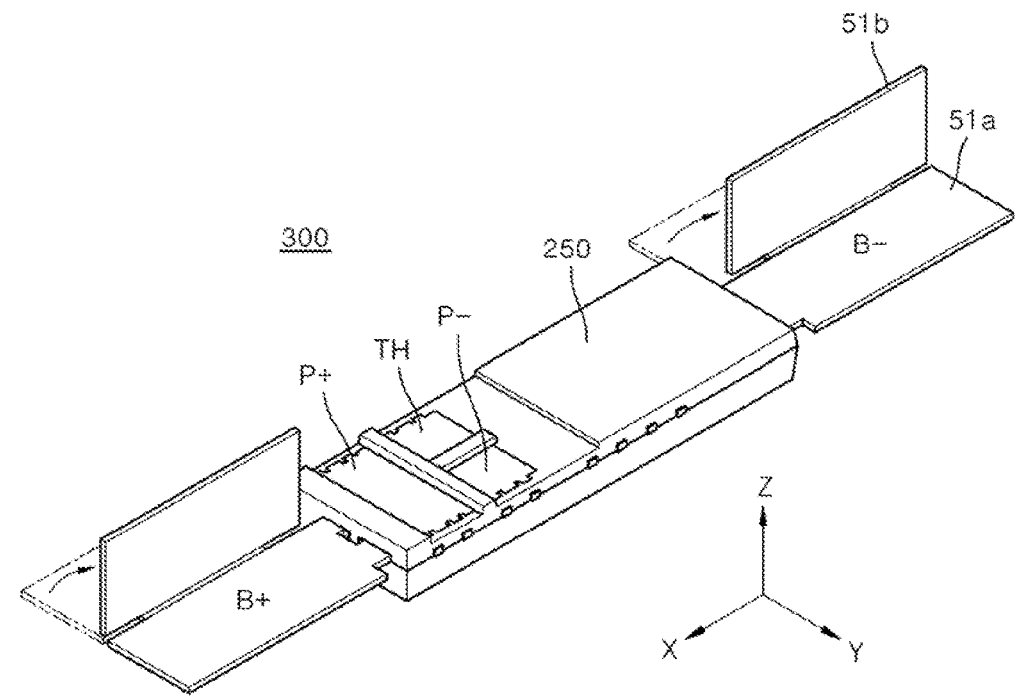

[FIG. 8]
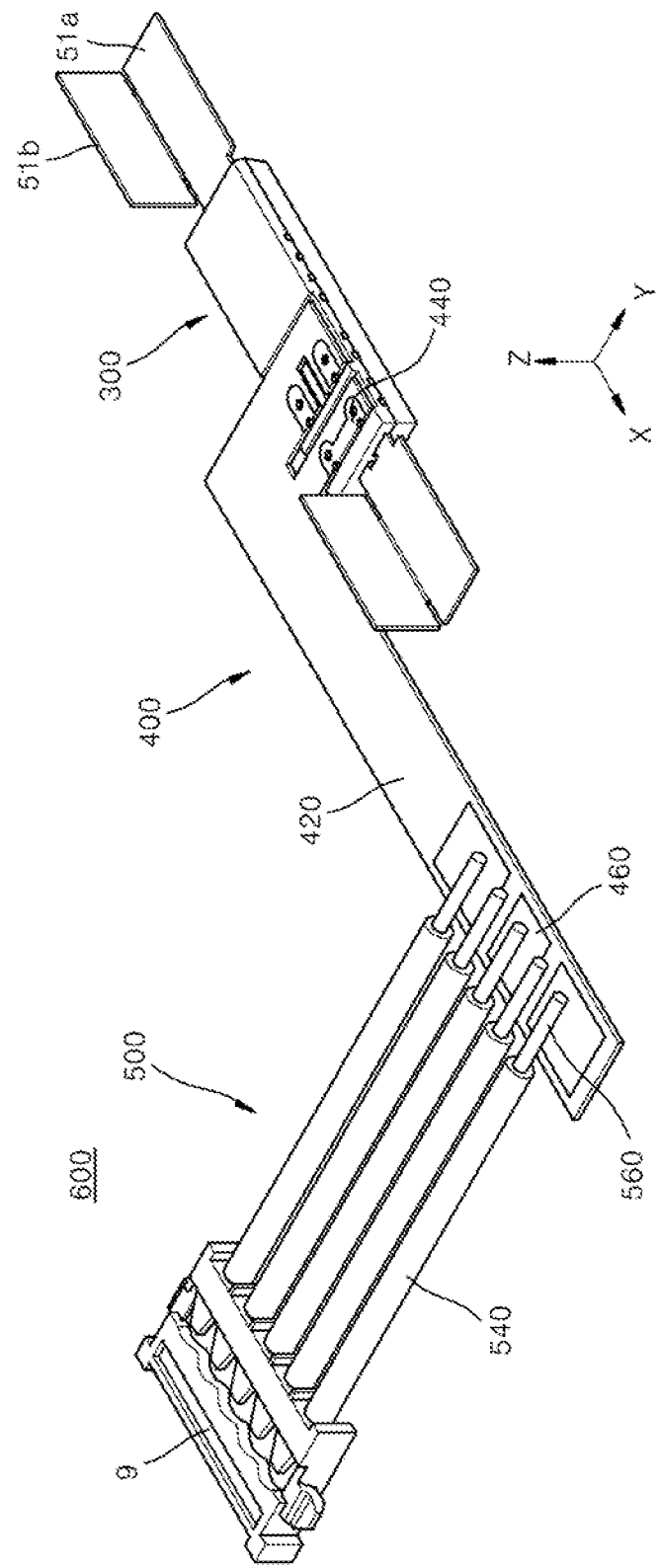

[FIG. 9]
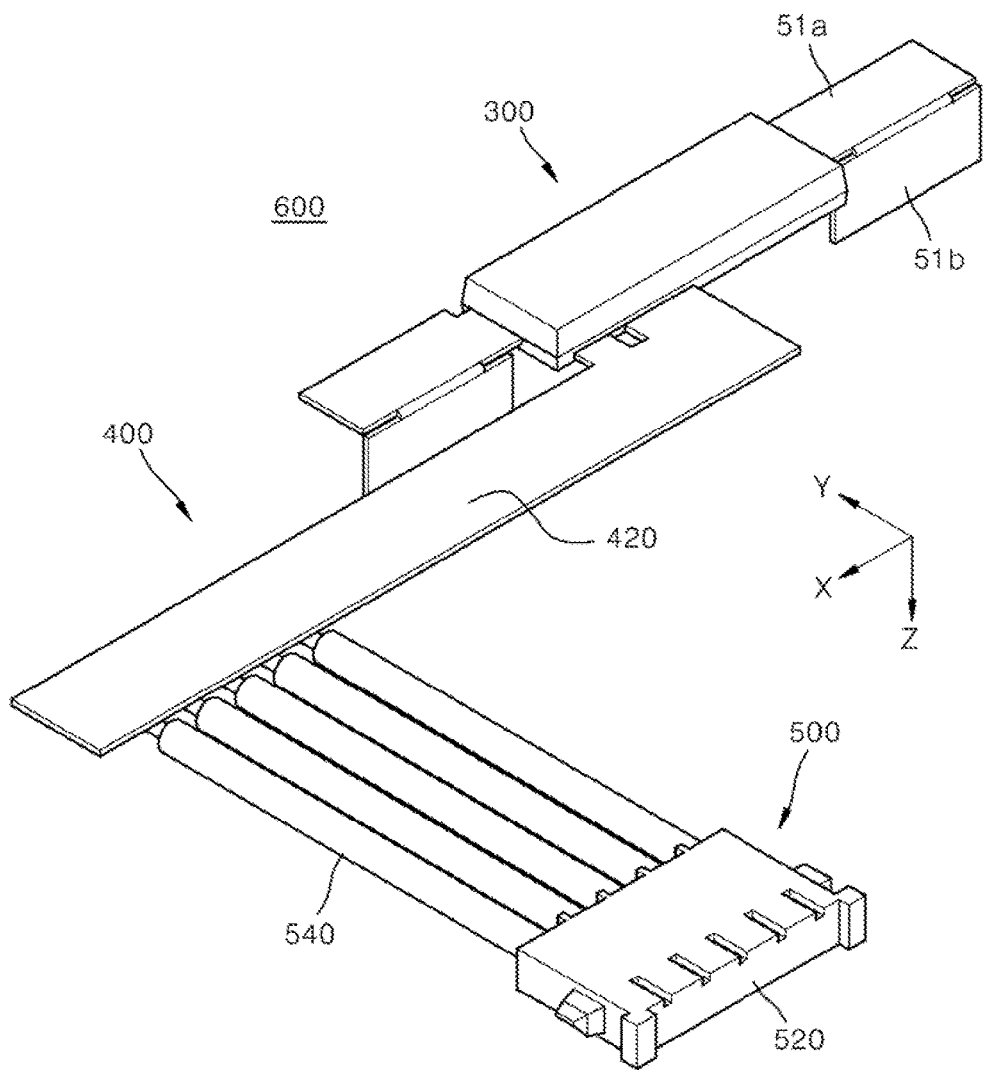

[FIG. 10]
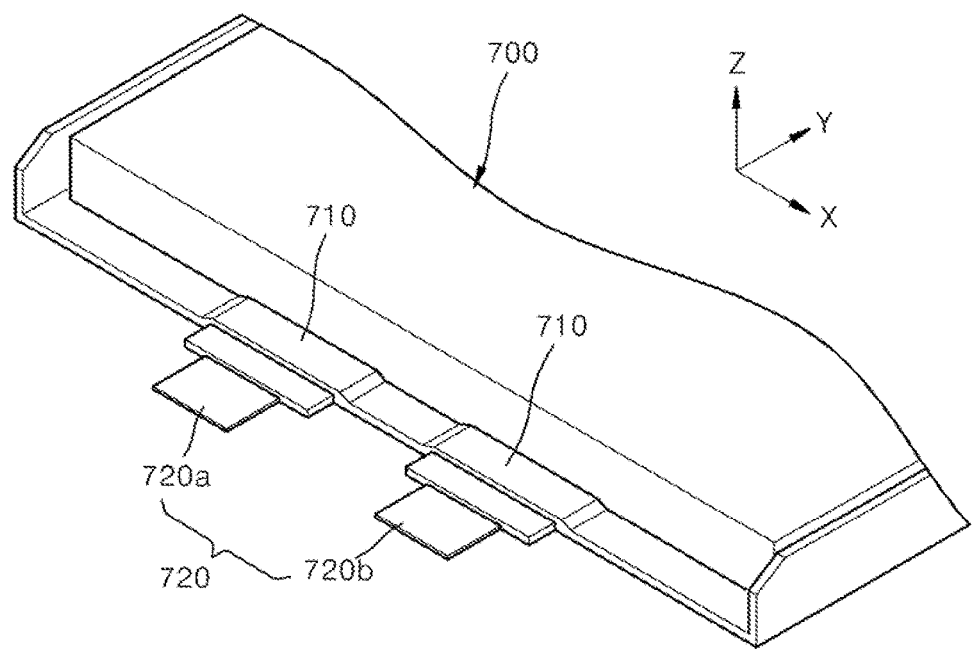
[FIG. 11]
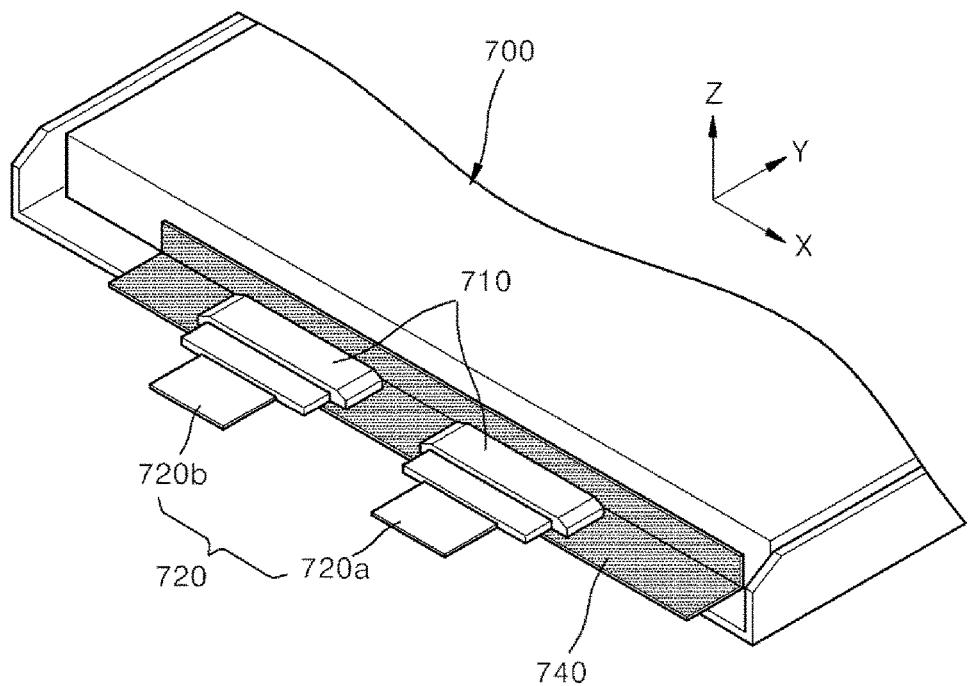

[FIG. 12]
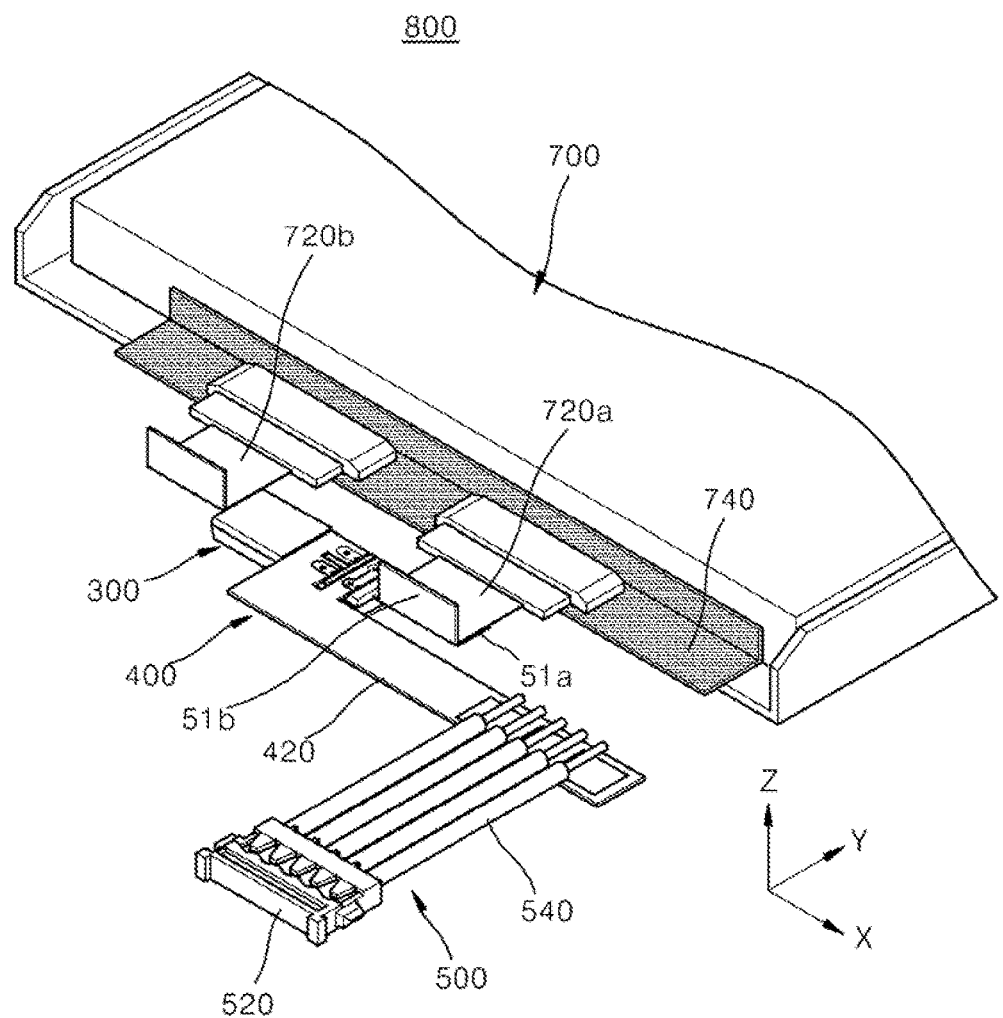

[FIG. 13]
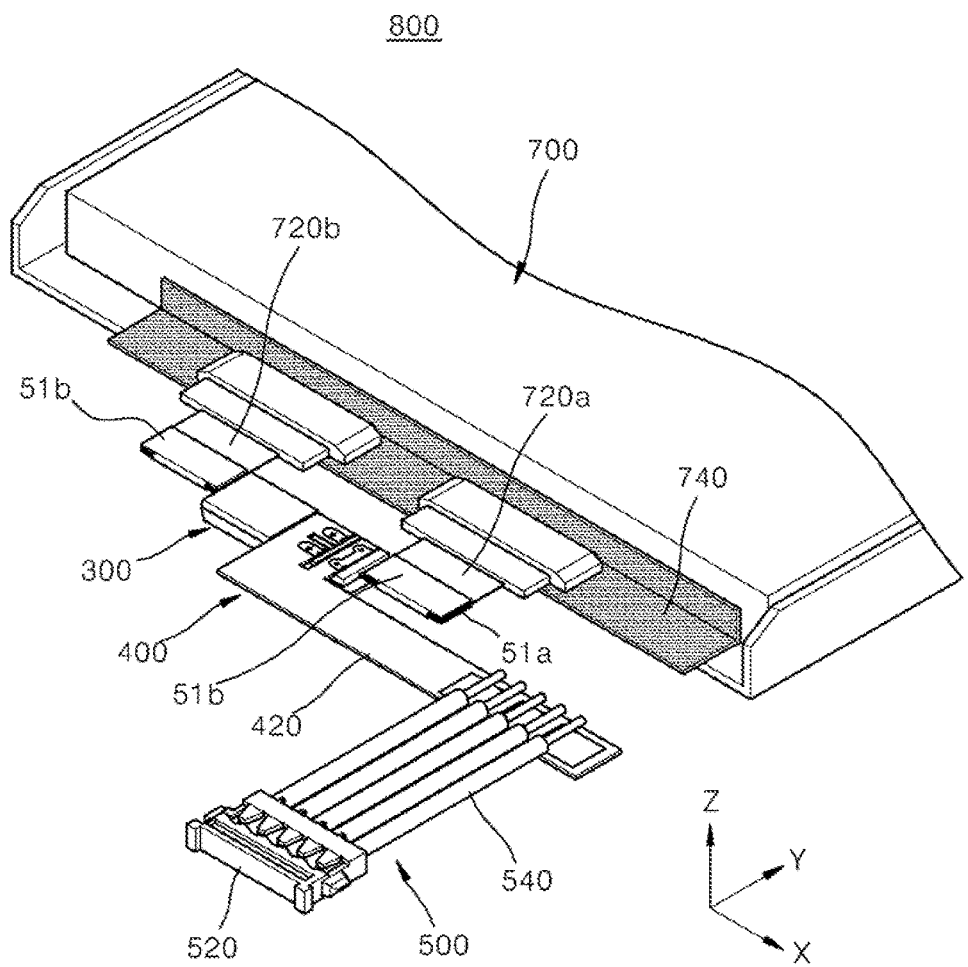

[FIG. 14]
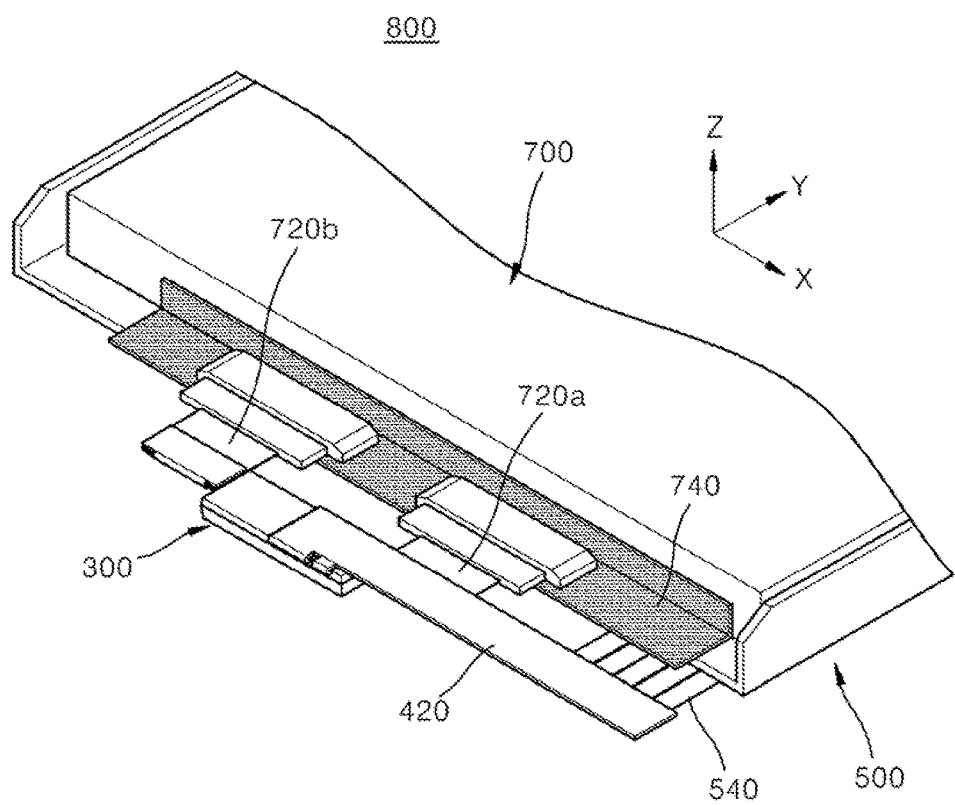

[FIG. 15]
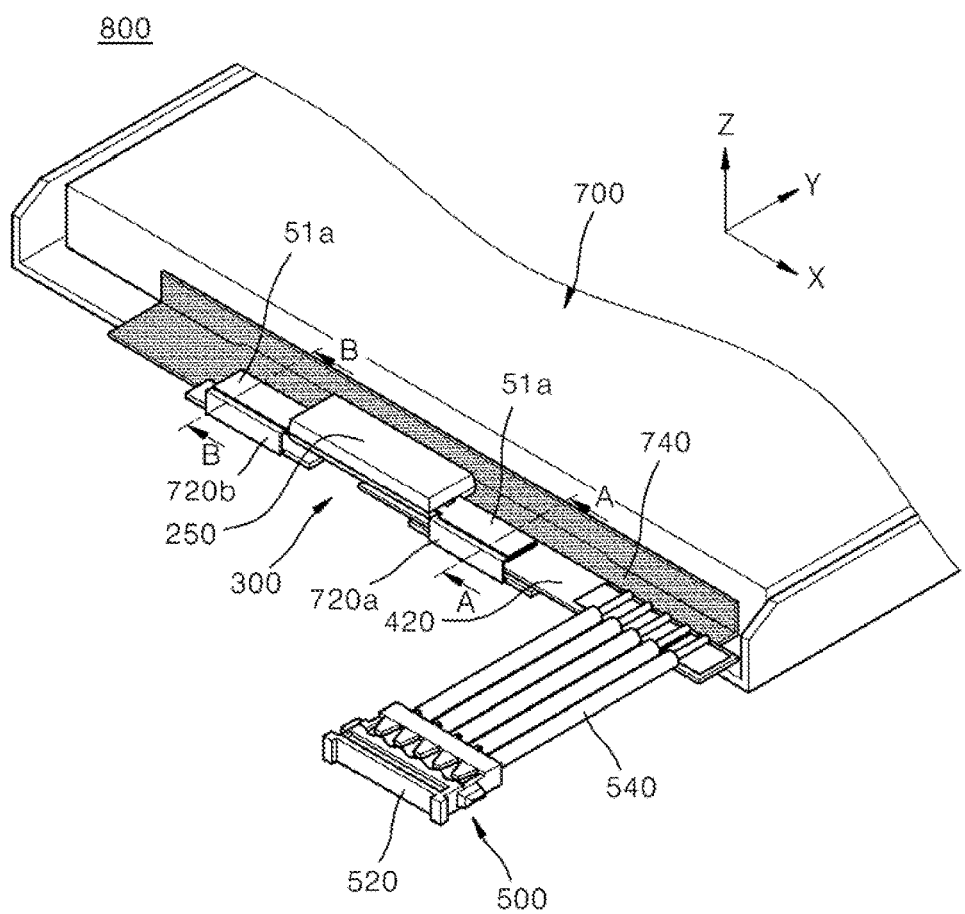

[FIG. 16]
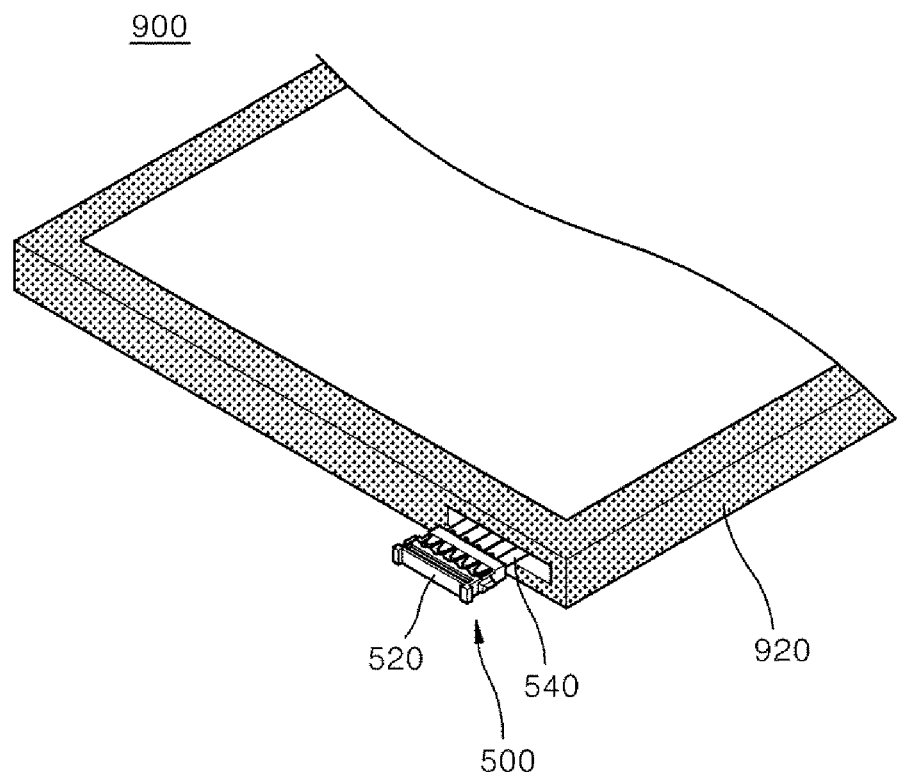
[FIG. 17]
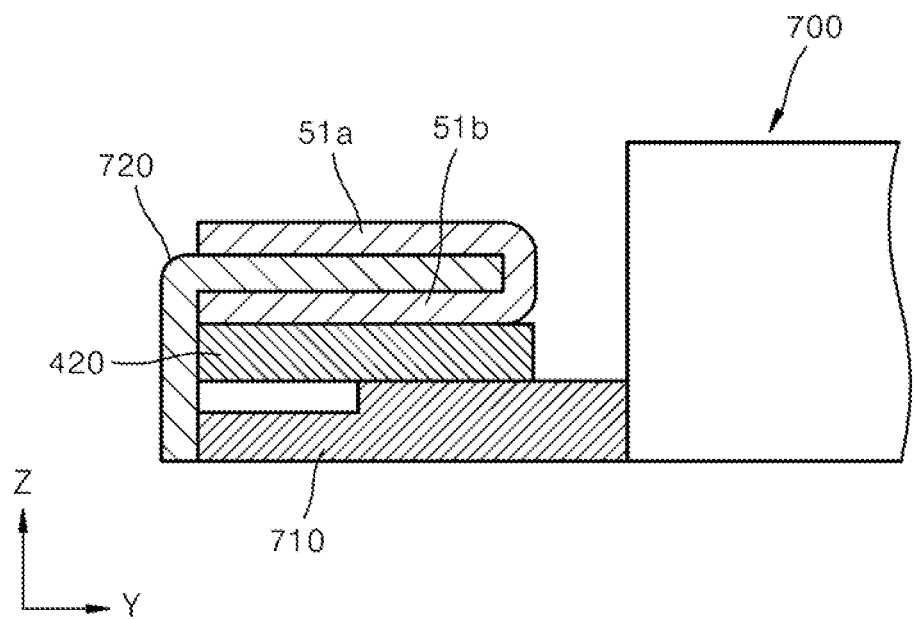

[FIG. 18]
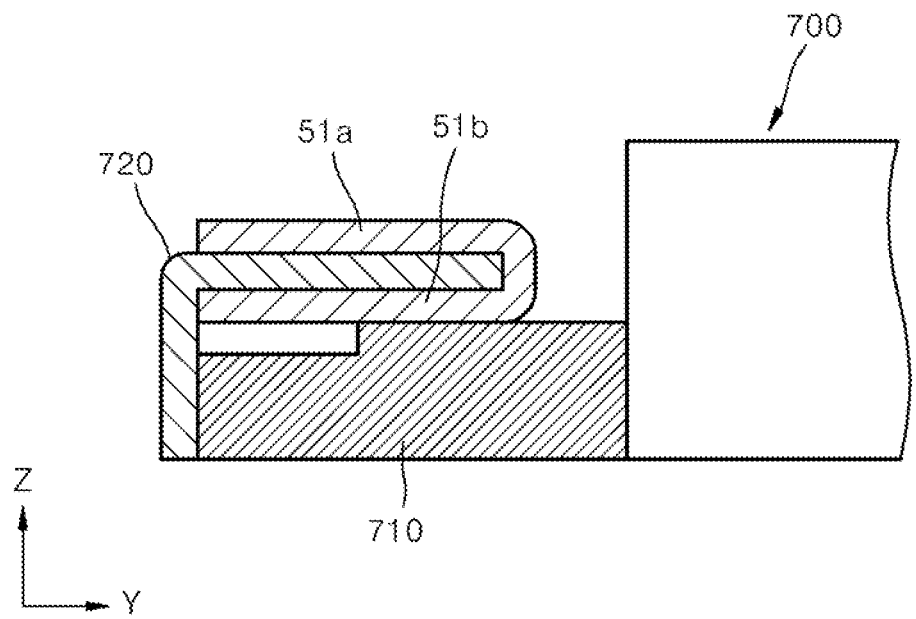
[FIG. 19]
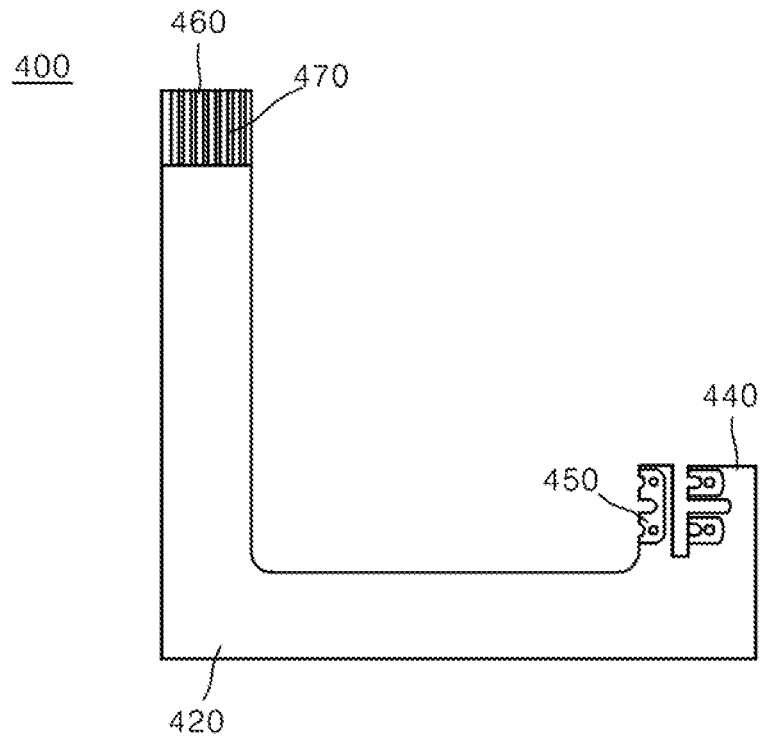

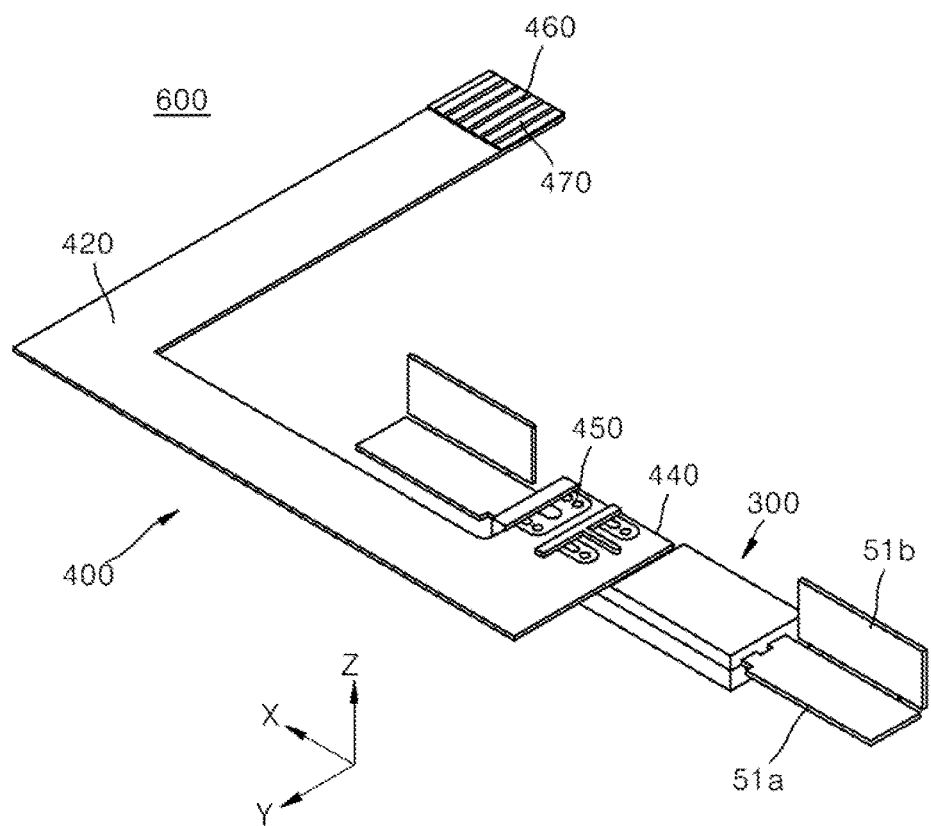
[FIG. 20]

[FIG. 21]
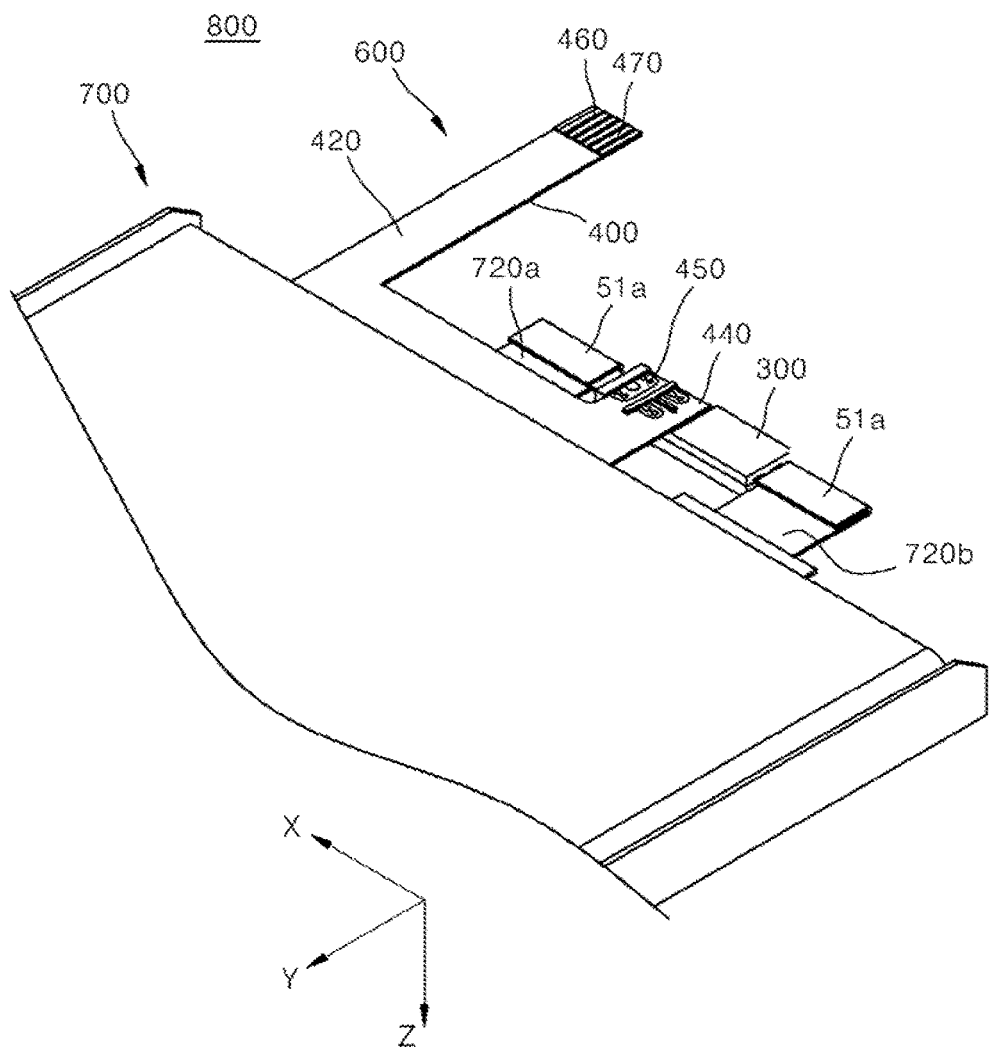

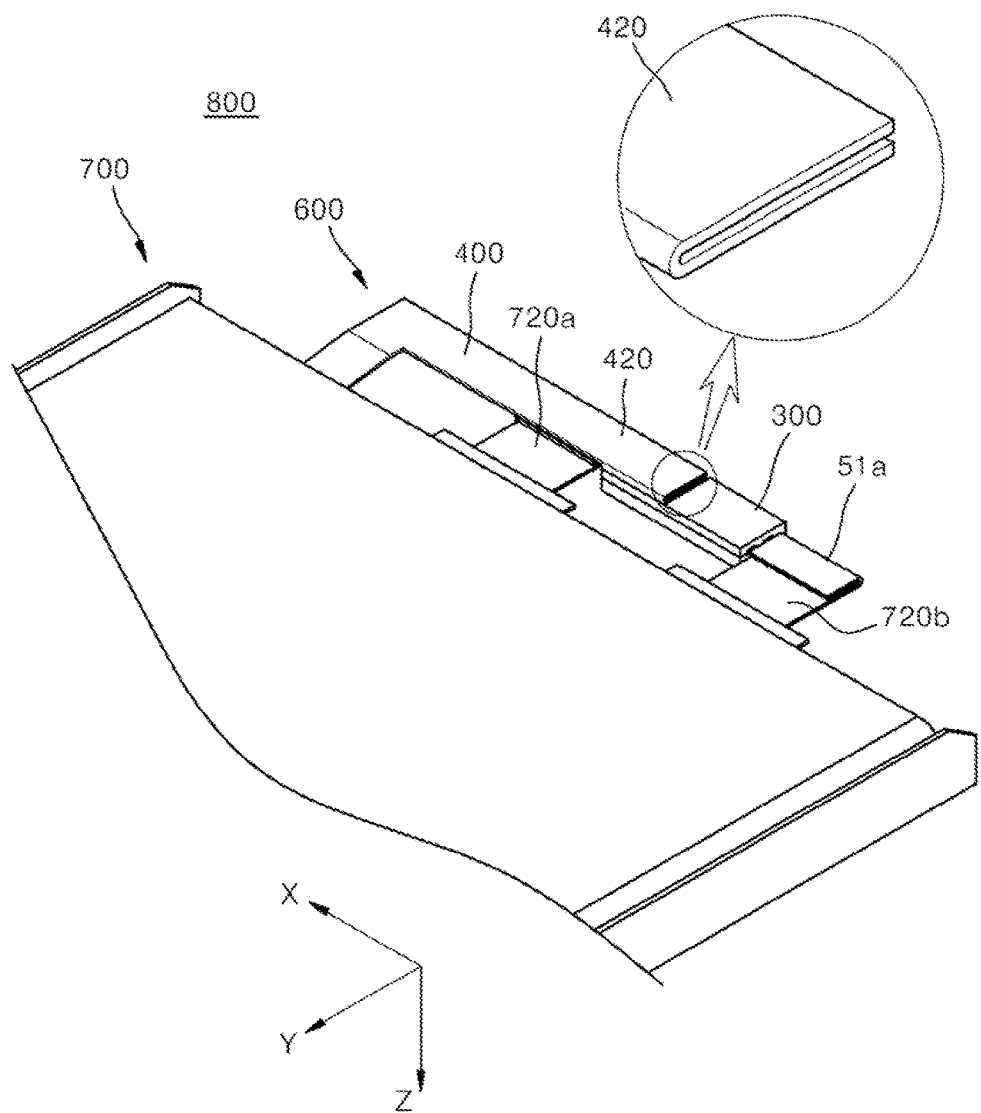
[FIG. 22]

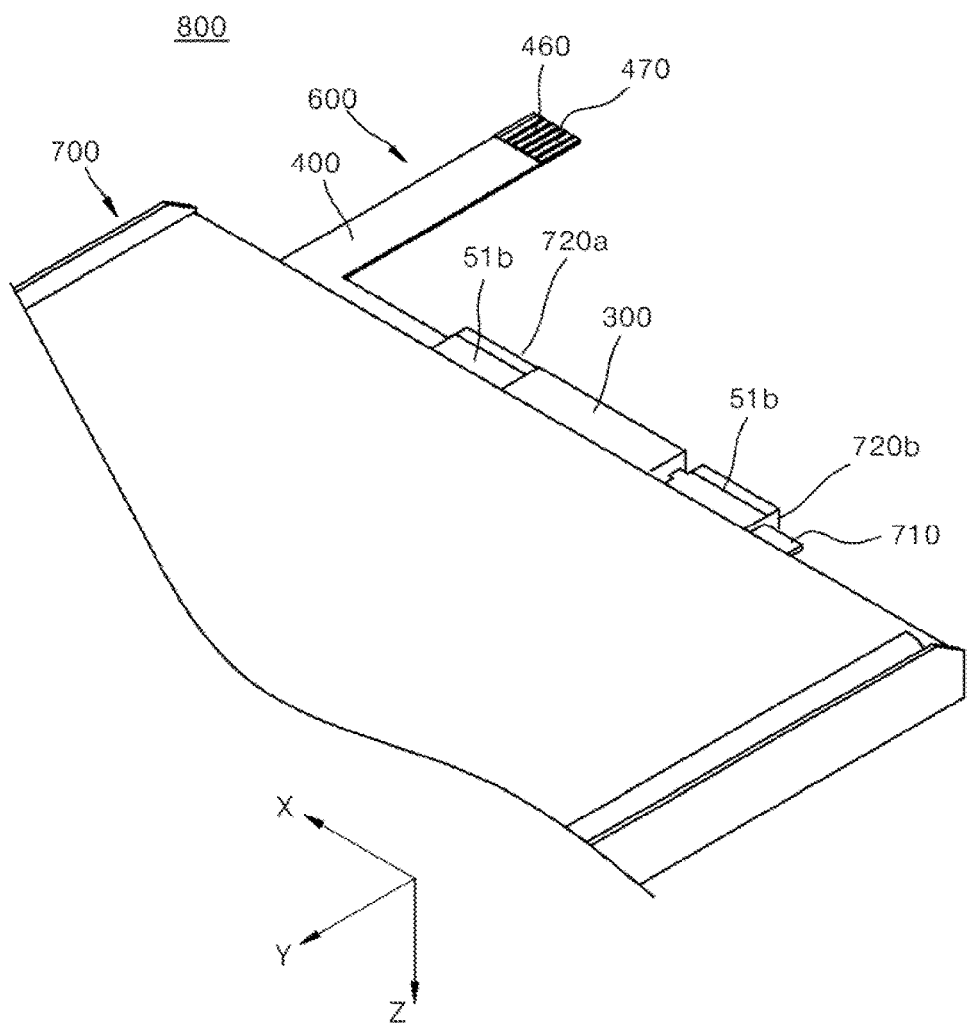
[FIG. 23]

[FIG. 24]
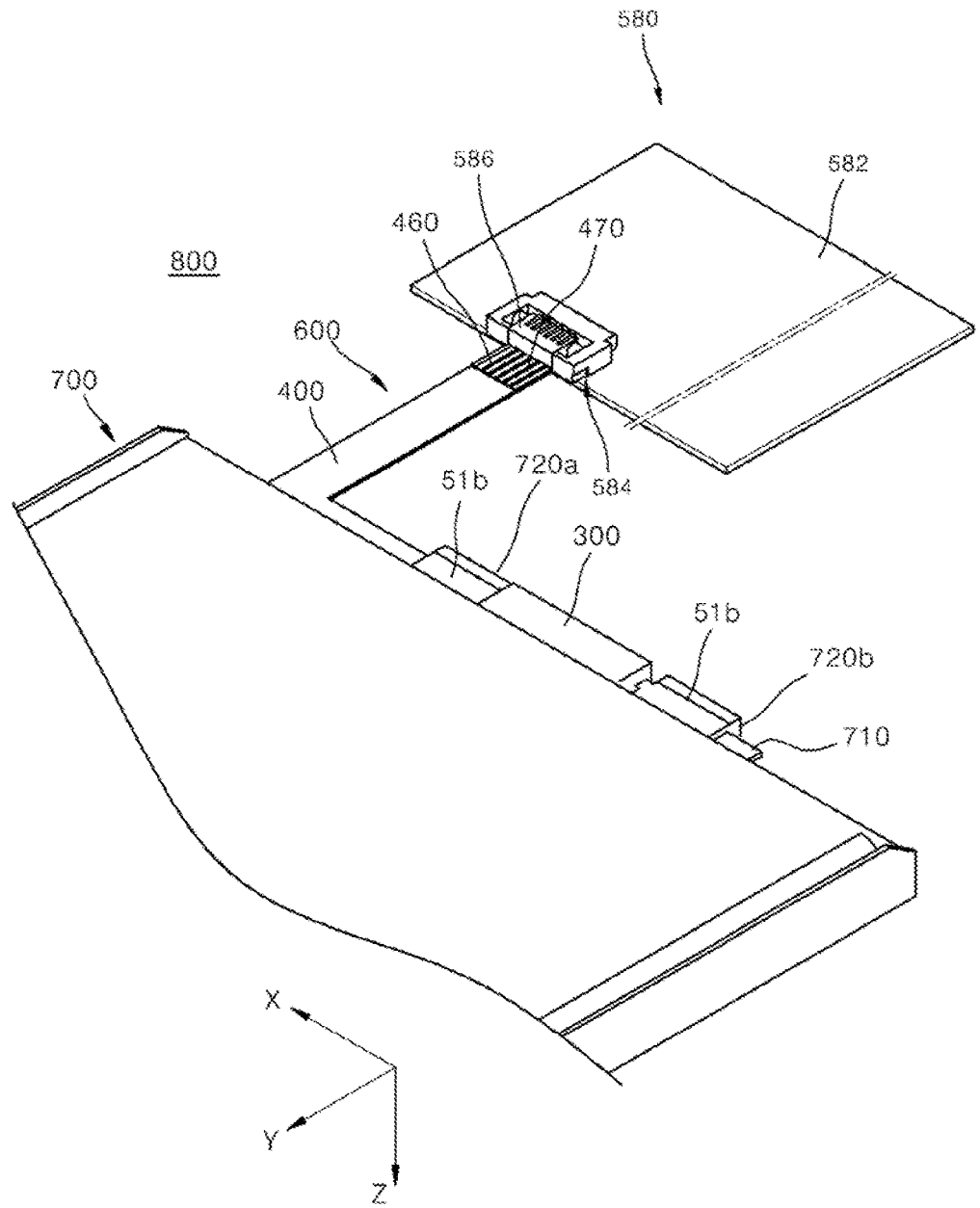

[FIG. 25]
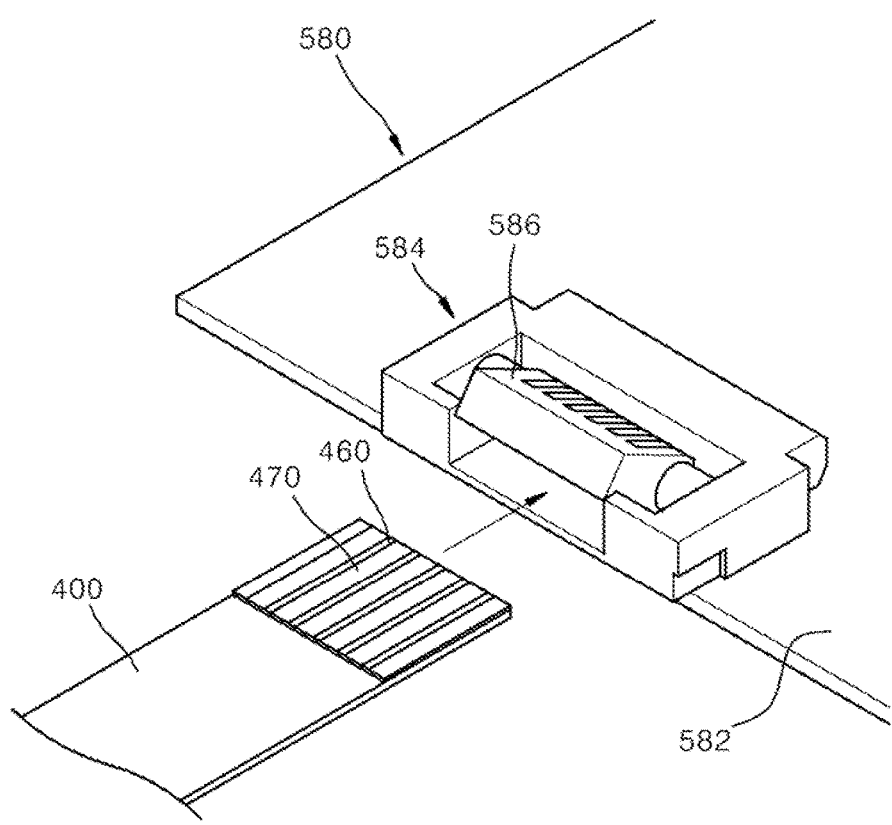

[FIG. 26]
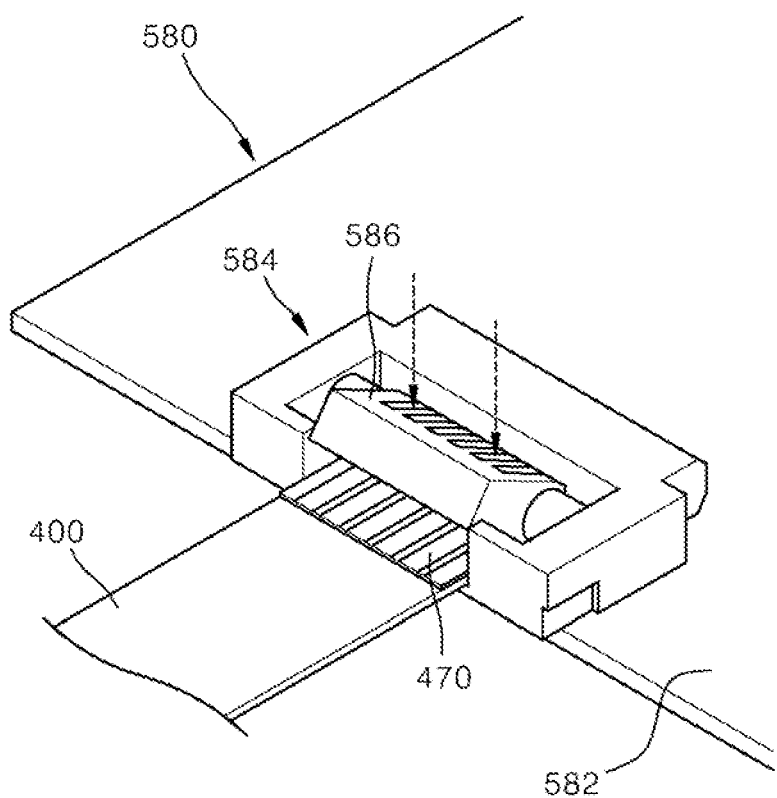

BATTERY PROTECTION CIRCUIT MODULE PACKAGE, BATTERY PACK AND ELECTRONIC DEVICE INCLUDING SAME

TECHNICAL FIELD

The present invention relates to a battery protection circuit module package, and a battery pack and an electronic device including the same and, more particularly, to a battery protection circuit module package capable of reducing battery pack size, and a battery pack and an electronic device including the same.

BACKGROUND ART

A battery is generally used in mobile devices such as a mobile phone and a personal digital assistant (PDA). As a battery most commonly used in the mobile devices, a lithium ion battery is heated when overcharge or overcurrent occurs, and even has the risk of explosion as well as performance degradation if heating is continued and thus temperature thereof is increased. Accordingly, a typical battery includes a protection circuit module for detecting and blocking overcharge, overdischarge, and overcurrent, or uses an external protection circuit for detecting overcharge, overdischarge, or heating and blocking operation of the battery. This conventional protection circuit is generally produced by soldering a protection integrated circuit (IC), a field effect transistor (FET), resistors, capacitors, etc. on a printed circuit board (PCB). However, the conventional protection circuit may not easily achieve a small size because the protection IC, the FET, the resistors, and the capacitors occupy an excessively large space. Furthermore, an additional process is required to mount the protection circuit in a battery pack. After the protection circuit is mounted, a process for additionally connecting external connection terminals or internal connection terminals thereof through wires, wire bonding, the pattern of the PCB, or exposed terminals of the PCB is complicated.

DETAILED DESCRIPTION OF THE INVENTION

Technical Problem

The present invention provides a battery protection circuit module package capable of achieving high integration and size reduction, and a battery pack and an electronic device including the same. However, the scope of the present invention is not limited thereto.

Technical Solution

According to an aspect of the present invention, there is provided a battery protection circuit module package including a lead frame including a plurality of leads space apart from each other, and capable of being coupled and electrically connected to electrode tabs of a battery cell, battery protection circuit devices mounted on the lead frame and including a positive temperature coefficient (PTC) structure, and an encapsulant for encapsulating the battery protection circuit devices to expose a part of the lead frame.

The PTC structure may include a PTC device, and a first metal layer and a second metal layer respectively coupled to two sides of the PTC device, and the first and second metal layers may be respectively mounted on the leads spaced apart from each other.

The lead frame may include a first internal connection terminal lead and a second internal connection terminal lead respectively provided at two edges, exposed by the encapsulant, and capable of being coupled and electrically connected to the electrode tabs of the battery cell, external connection terminal leads provided between the first and second internal connection terminal leads and serving as a plurality of external connection terminals, and device mounting leads provided between the first and second internal connection terminal leads and having the battery protection circuit devices mounted thereon.

Each of the first and second internal connection terminal leads may be foldable about a predetermined virtual axis located in the first or second internal connection terminal lead.

Each of the first and second internal connection terminal leads may include a slit provided on a folding axis in such a manner that each of the first and second internal connection terminal leads is foldable.

The lead frame may be formed of nickel or a nickel-plated copper plate.

The battery protection circuit devices may further include a protection integrated circuit (IC), field effect transistors (FETs), and one or more passive devices, the PTC structure and the passive devices may be provided to interconnect at least some of the leads spaced apart from each other, and the battery protection circuit module package may further include an electrical connection member for electrically interconnecting any two selected from the group consisting of the protection IC, the FETs, and the leads, thereby configuring a battery protection circuit without using a printed circuit board (PCB). The electrical connection member may include a bonding wire or bonding ribbon.

The protection IC and the FETs may not be inserted and fixed into the lead frame in the form of a semiconductor package but may be mounted and fixed onto at least a part of a surface of the lead frame using surface mounting technology in the form of a chip die not encapsulated with an encapsulant.

According to another aspect of the present invention, there is provided a battery protection circuit module package assembly including a lead frame including a plurality of leads space apart from each other, and capable of being coupled and electrically connected to electrode tabs of a battery cell, battery protection circuit devices mounted on the lead frame and including a positive temperature coefficient (PTC) structure, an encapsulant for encapsulating the battery protection circuit devices to expose a part of the lead frame, a flexible printed circuit board (FPCB) having one end coupled and electrically connected to the lead frame, and a connector coupled and electrically connected to the other end of the FPCB.

The lead frame may include a first internal connection terminal lead and a second internal connection terminal lead respectively provided at two edges, exposed by the encapsulant, and capable of being coupled and electrically connected to the electrode tabs of the battery cell, external connection terminal leads provided between the first and second internal connection terminal leads and serving as a plurality of external connection terminals, and device mounting leads provided between the first and second internal connection terminal leads and having the battery protection circuit devices mounted thereon.

Each of the first and second internal connection terminal leads may be foldable about a predetermined virtual axis located in the first or second internal connection terminal lead.

Each of the first and second internal connection terminal leads may include a slit provided on a folding axis in such a manner that each of the first and second internal connection terminal leads is foldable.

The external connection terminal leads may be coupled to the FPCB or the FPCB may be coupled to the connector using at least one method selected from the group consisting of laser welding, resistance welding, soldering, conductive adhesive, and conductive tape.

According to another aspect of the present invention, there is provided a battery protection circuit module package assembly including a lead frame including a plurality of leads space apart from each other, and capable of being coupled and electrically connected to electrode tabs of a battery cell, battery protection circuit devices mounted on the lead frame and including a positive temperature coefficient (PTC) structure, an encapsulant for encapsulating the battery protection circuit devices to expose a part of the lead frame, and a flexible printed circuit board (FPCB) having one end coupled and electrically connected to the lead frame, and the other end exposing a conductive terminal configured to be directly and electrically connected to a main board of an electronic device connectable to the battery pack.

According to another aspect of the present invention, there is provided a battery pack including a battery cell having a pair of electrode tabs protruding therefrom, wherein the electrode tabs include a positive tap and a negative tap, and a battery protection circuit module package including a lead frame including a plurality of leads space apart from each other, and having mounted thereon battery protection circuit devices including a positive temperature coefficient (PTC) structure, and an encapsulant for encapsulating the battery protection circuit devices to expose at least two sides of the lead frame to be coupled to the electrode tabs.

According to another aspect of the present invention, there is provided an electronic device including a battery cell having a pair of electrode tabs protruding therefrom, wherein the electrode tabs include a positive tap and a negative tap, a battery protection circuit module package including a lead frame including a plurality of leads space apart from each other, and having mounted thereon battery protection circuit devices including a positive temperature coefficient (PTC) structure, and an encapsulant for encapsulating the battery protection circuit devices to expose at least two sides of the lead frame to be coupled to the electrode tabs, a flexible printed circuit board (FPCB) having one end coupled and electrically connected to the lead frame, and the other end exposing a conductive terminal, and a main board directly and electrically connected to the conductive terminal.

To allow the conductive terminal to be directly and electrically connected to the main board, the main board may include a housing having a space into which the other end of the FPCB is inserted, and the housing may include a fixer for fixing the other end of the FPCB inserted into the space.

Advantageous Effects

According to embodiments of the present invention, a battery protection circuit module package capable of achieving high integration and size reduction, and a battery pack and an electronic device including the same may be provided. However, the scope of the present invention is not limited to the above-described effect.

DESCRIPTION OF THE DRAWINGS

FIG. 1 is a circuit diagram of a battery protection circuit to be implemented using a battery protection circuit module package according to an embodiment of the present invention.

FIG. 2 is a structural view showing the configuration of a multilayer chip for configuring the battery protection circuit module package according to an embodiment of the present invention.

FIG. 3 is a circuit diagram of another battery protection circuit to be implemented using the battery protection circuit module package according to an embodiment of the present invention.

FIG. 4 is a perspective view showing the structure of a lead frame and battery protection circuit devices for configuring the battery protection circuit module package according to an embodiment of the present invention.

FIG. 5 is a conceptual view of a battery protection circuit module package according to an embodiment of the present invention.

FIGS. 6 and 7 are perspective views showing that internal connection terminal leads are folded in the battery protection circuit module package according to an embodiment of the present invention.

FIGS. 8 and 9 are perspective views of a battery protection circuit module package assembly according to another embodiment of the present invention.

FIGS. 10 to 16 are perspective views showing a method of manufacturing a battery pack according to still another embodiment of the present invention.

FIG. 17 is a cross-sectional view cut along line A-A of FIG. 15.

FIG. 18 is a cross-sectional view cut along line B-B of FIG. 15.

FIG. 19 is a plan view of a flexible printed circuit board (FPCB) for configuring a battery protection circuit module package assembly according to still another embodiment of the present invention.

FIG. 20 is a perspective view of the battery protection circuit module package assembly according to still another embodiment of the present invention.

FIGS. 21 to 23 are perspective views showing a method of manufacturing a battery pack according to still another embodiment of the present invention.

FIG. 24 is a perspective view showing that the battery pack is coupled to a main board of an electronic device, according to still another embodiment of the present invention.

FIGS. 25 and 26 are perspective views showing a process for coupling the battery pack to the main board of the electronic device, according to still another embodiment of the present invention.

MODE OF THE INVENTION

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers are exaggerated for clarity.

It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements. As used herein, the term "and/or" refers to one of or a combination of at least two listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

In embodiments of the present invention, a lead frame is an element in which lead terminals are patterned on a metal frame, and may differ from a printed circuit board (PCB) in which a metal wiring layer is provided on an insulating core, in terms of structures or thicknesses thereof.

Battery Protection Circuit Module Package

FIG. 1 is a circuit diagram of a battery protection circuit 10 to be implemented using a battery protection circuit module package according to an embodiment of the present invention.

As illustrated in FIG. 1, the battery protection circuit 10 according to an embodiment of the present invention includes first and second internal connection terminals B+ and B− to be connected to a battery cell, and first to third external connection terminals P+, TH, and P− to be connected to a charger for charging and to be connected to an electronic device (e.g., a mobile device) operating by battery power, for discharging. Herein, among the first to third external connection terminals P+, TH, and P−, the first and third external connection terminals P+ and P− are used to supply power and the other second external connection terminal TH is used to detect a battery type and perform charging appropriately for the battery type. In addition, the second external connection terminal TH may be provided as a thermistor for detecting battery temperature when charging, has another function, and is used as a terminal.

The battery protection circuit 10 may have a connection structure of a dual field effect transistor (FET) chip 110, a protection integrated circuit (IC) 120, resistors R1, R2, and R3, a varistor V1, and capacitors C1 and C2. The dual FET chip 110 includes first and second FETs FET1 and FET2 having a common drain. The protection IC 120 has a terminal (e.g., VDD) connected through the resistor R1 to the first internal connection terminal B+ serving as (+) terminal of the battery, applying a charge or discharge voltage through a first node n1, and detecting a battery voltage, a reference terminal (e.g., VSS) for providing a reference voltage of an internal operation voltage of the protection IC 120, a detection terminal (e.g., V−) for detecting charge/discharge and overcurrent states, a discharge off signal output terminal (e.g., DO) for switching off the first FET FET1 in overdischarge state, and a charge off signal output terminal (e.g., CO) for switching off the second FET FET2 in overcharge state.

In this case, the protection IC 120 includes a reference voltage setter, a comparer for comparing a reference voltage and a charge/discharge voltage to each other, an overcurrent detector, and a charge/discharge detector. Herein, reference voltages for determining the charge and discharge states may be changed depending on specifications required by a user, and the charge and discharge states are determined based on the reference voltages by detecting the voltage difference between terminals of the protection IC 120.

The protection IC 120 is configured in such a manner that the terminal DO is changed to LOW state to switch off the first FET FET1 in overdischarge state, that the terminal CO is changed to LOW state to switch off the second FET FET2 in overcharge state, and that the second FET FET2 is switched off when charging and the first FET FET1 is switched off when discharging in overcurrent state.

The resistor R1 and the capacitor C1 stabilize variations in power supply of the protection IC 120. The resistor R1 is connected between the first node n1 serving as a power (V1) supply node of the battery, and the terminal VDD of the protection IC 120, and the capacitor C1 is connected between the terminal VDD and the terminal VSS of the protection IC 120. Herein, the first node n1 is connected to the first internal connection terminal B+ and the first external connection terminal P+. If the resistor R1 has a high value, when a voltage is detected, the detected voltage is increased due to a current flowing into the protection IC 120. As such, the value of the resistor R1 is set to an appropriate value equal to or less than 1 KΩ. In addition, for stable operation, the capacitor C1 may have an appropriate value equal to or greater than 0.01 μF, for example, 0.1 μF.

The resistors R1 and R2 serve as a current limiter if a charger provides a high voltage exceeding absolute maximum ratings of the protection IC 120 or if the charger is connected with wrong polarity. The resistor R2 is connected between the terminal V− of the protection IC 120 and a second node n2 connected to a source terminal S2 of the second FET FET2. Since the resistors R1 and R2 are closely related to power consumption, a sum of the values of the resistors R1 and R2 is set to be greater than 1 KΩ. In addition, since recovery may not occur after overcharge blocking if the value of the resistor R2 is excessively large, the value of the resistor R2 is set to a value equal to or less than 10 KΩ. For example, the resistor R1 may have a value of 1 KΩ and the resistor R2 may have a value of 2.2 KΩ.

The capacitor C2 is connected between the second node n2 (or the third external connection terminal P−) and a source terminal S1 of the first FET FET1 (or the terminal VSS). The capacitor C2 does not exert a strong influence on product features of the battery protection circuit 10, but is added upon a request of the user or for stability. The capacitor C2 is used to achieve system stabilization by improving tolerance to voltage variations or external noise. For stable operation, the capacitor C2 may have a value of, for example, 0.1 µF.

The resistor R3 and the varistor V1 are devices for electrostatic discharge (ESD) and surge protection, and are connected in parallel to each other between the second external connection terminal TH and the second node n2 (or the third external connection terminal P−). The varistor V1 is a device for reducing resistance thereof when overvoltage occurs, and may minimize, for example, circuit damage due to overvoltage.

As a safety device for preventing battery rupture, a positive temperature coefficient (PTC) structure PTC may be intervened between the second internal connection terminal B− and the capacitors C1 and C2. For example, although a PTC structure serves as a current path at a predetermined temperature or below, if overcurrent occurs and the temperature is increased above the predetermined temperature, the PTC structure blocks or reduces the current flow and thus may prevent battery rupture.

According to the present invention, the battery protection circuit module package is implemented by packaging the battery protection circuit 10 of FIG. 1 which includes the external connection terminals P+, P−, and TH, and the internal connection terminals B+ and B−. For example, the battery protection circuit module package may be implemented by encapsulating and packaging the passive devices such as the resistors R1, R2, and R3, the varistor V1, and the capacitors C1 and C2, the protection IC 120, the dual FET chip 110, and the PTC structure PTC using an encapsulant M.

The above-described battery protection circuit 10 according to an embodiment of the present invention is merely an example, and the configuration, number, or position of a protection IC, FETs, or passive devices may be appropriately changed depending on the function of the battery protection circuit 10.

FIG. 2 is a structural view showing the configuration of a multilayer chip 100a for configuring the battery protection circuit module package according to an embodiment of the present invention.

As illustrated in FIG. 2, the dual FET chip 110 and the protection IC 120 are stacked on one another or provided adjacent to each other. For example, the protection IC 120 may be stacked on a top surface of the dual FET chip 110, or the dual FET chip 110 may be provided adjacent to a left or right side of the protection IC 120.

The dual FET chip 110 embeds therein two FETs having a common drain, i.e., the first and second FETs FET1 and FET2, and includes a first gate terminal G1 and a first source terminal S1 of the first FET FET1 and a second gate terminal G2 and a second source terminal S2 of the second FET FET2 as external terminals on the top surface of the dual FET chip 110. In addition, a common drain terminal may be provided on a bottom surface of the dual FET chip 110.

The protection IC 120 is stacked on the top surface of the dual FET chip 110. The protection IC 120 is stacked on an area (e.g., a central area) of the dual FET chip 110 other than the area having provided the external terminals thereon. In this case, an insulating layer for insulation may be provided between the protection IC 120 and the dual FET chip 110, and the protection IC 120 and the dual FET chip 110 may be adhered to each other using an insulating adhesive. Since the dual FET chip 110 is generally larger than the protection IC 120, the protection IC 120 is stacked on the dual FET chip 110.

After the protection IC 120 is stacked on the top surface of the dual FET chip 110, the terminal DO of the protection IC 120 is electrically connected to the first gate terminal G1 through wire or wiring, and the terminal CO of the protection IC 120 is electrically connected to the second gate terminal G2 through wire or wiring. A description of connection structures of the other terminals will be given below. The protection IC 120 and the dual FET chip 110 which are stacked on one another as described above are called 'the multilayer chip 100a'.

In the battery protection circuit module package according to an embodiment of the present invention, by employing the multilayer chip 100a in which the protection IC 120 and the dual FET chip 110 are stacked on one another, a mounting area thereof on a lead frame to be described below may be reduced and thus a battery may achieve a small size or a high capacity.

FIG. 3 is a circuit diagram of another battery protection circuit to be implemented using the battery protection circuit module package according to an embodiment of the present invention. FIG. 3 is a circuit diagram of a battery protection circuit in which first and second FETs and a protection IC are integrated into a single chip, and is an equivalent circuit diagram of FIG. 1.

As illustrated in FIG. 3, if the protection IC 120 and the two common-drain FETs FET1 and FET2 of FIG. 1 are integrated into a flip chip 100b, the circuit may equally perform the operation described above in relation to FIG. 1 and the configuration thereof may be simplified. The flip chip 100b embeds therein the first and second FETs having a common drain and serving as switching devices in overdischarge and overcharge states, and the protection IC for controlling overdischarge and overcharge operations. In addition, since the flip chip 100b is implemented by integrating the multilayer chip 100a including the protection IC 120 and the two common-drain FETs FET1 and FET2 of FIG. 1 into a single chip, the operation or circuit configuration of the flip chip 100b is the same as that of the multilayer chip 100a including the protection IC 120 and the two common-drain FETs FET1 and FET2 of FIG. 1.

As such, the flip chip 100b exposes a voltage application terminal VDD for applying a charge voltage and a discharge voltage, a detection terminal V− for detecting charge and discharge states, a first source terminal S1 serving as a source terminal of the first FET, and a second source terminal S2 serving as a source terminal of the second FET on one surface thereof as external terminals for external connection. The discharge blocking signal output terminal DO or the charge blocking signal output terminal CO of the protection IC 120 of the circuit of FIG. 1 is embedded in the flip chip 100b and thus is not exposed as an external terminal. The external terminals VDD, V−, S1, and S2 have a solder ball structure for external connection and bonding and thus are coupled using flip chip bonding. The positions of the external terminals VDD, V−, S1, and S2 may vary as necessary, and the number of the terminals may be increased or reduced in various ways to improve electrical conductivity or placement efficiency. For example, the external connection terminals of the flip chip 100b for external connection and bonding may have a 3×3 structure. The voltage application terminal VDD for applying a charge voltage and a discharge voltage, a test terminal TP for a test, and the detection terminal V− for detecting charge and discharge states may be provided in the first row in a three-column structure, the first source terminal S1 may be provided in the second row in a three-column structure, and the second source terminal S2 may be provided in the third row in a three-column structure.

Alternatively, since the external terminals of the flip chip 100b may be soldered and electrically connected to leads, which require electrical connection, without using wire bonding, compared to wire bonding, electrical conductivity may be improved, production costs may be lowered, and process simplification and volume reduction may be achieved.

Additionally, according to a modified embodiment of the present invention, the surge protection circuit configured for electrostatic discharge (ESD) and surge protection may include a resistor R4 or a capacitor C4 instead of the varistor V1. That is, the surge protection circuit may be configured by interconnecting two resistors R3 and R4, one resistor R3 and one capacitor C4, or one resistor R3 and one varistor V1 in parallel.

In the present invention, the battery protection circuit module package is implemented by packaging the battery protection circuit of FIG. 3, which includes the external connection terminals P+, P−, and TH, and the internal connection terminals B+ and B−. For example, the battery protection circuit module package may be implemented by encapsulating and packaging the passive devices such as the resistors R1, R2, R3, and R4, the varistor V1, and the capacitors C1, C2, and C3, the flip chip 100b, and the PTC structure PTC using the encapsulant M.

FIG. 4 is a perspective view showing the structure of a lead frame 50 and battery protection circuit devices 100a, 100b, 130, and 350 for configuring the battery protection circuit module package according to an embodiment of the present invention.

Referring to FIG. 4, a protection circuit structure 200a includes the lead frame 50 and the battery protection circuit devices 100a, 100b, 130, and 350 mounted on the lead frame 50. The lead frame 50 may be formed of nickel or a nickel-plated copper plate. The lead frame 50 has a structure in which a first internal connection terminal area A1, an external connection terminal area A2, a device and chip area A3, a PTC structure area A4, and a second internal connection terminal area A5 are sequentially provided. The external connection terminal area A2, the device and chip area A3, and the PTC structure area A4 are provided between the first and second internal connection terminal areas A1 and A5, and the order thereof may be changed in various ways. A top surface 50a of the lead frame 50 is a surface for mounting the battery protection circuit devices 100a, 130, and 350 thereon, and a bottom surface of the lead frame 50 may be a surface opposite to the top surface 50a. A part of the bottom surface of the lead frame 50 corresponding to the external connection terminal area A2 may be entirely or partially plated. A plating material may include at least one selected from the group consisting of gold, silver, nickel, tin, and chromium.

The first and second internal connection terminal areas A1 and A5 are respectively provided at two edges of the package, and first and second internal connection terminal leads B+ and B− serving as first and second internal connection terminals coupled and electrically connected to electrode tabs of a battery cell are provided thereon, respectively. For example, the first internal connection terminal lead B+ may be coupled to a positive electrode tab of the battery cell, and the second internal connection terminal lead B− may be coupled to a negative electrode tab of the battery cell. However, the polarities of the electrode tabs may be switched.

The external connection terminal area A2 is provided adjacent to the first internal connection terminal area A1, and first to third external connection terminal leads P+, TH, and P− serving as a plurality of external connection terminals are sequentially provided thereon. The order of the first to third external connection terminal leads P+, TH, and P− may be changed in various ways. The first internal connection terminal lead B+ may extend from the first external connection terminal lead P+, or the first external connection terminal lead P+ may extend from the first internal connection terminal lead B+. Alternatively, the first internal connection terminal lead B+ may be spaced apart from the first external connection terminal lead P+.

A plurality of passive devices 130 (see R1, R2, R3, C1, C2, C3, and V1 of FIG. 1 or 3), a protection IC, and a multilayer chip (see 100a of FIGS. 1 and 2) including FETs, which are the battery protection circuit devices, are provided on device mounting leads 135 of the chip area A3. The device and chip area A3 is an area for providing thereon a protection IC and a dual FET chip for configuring a battery protection circuit. For example, a die pad for mounting thereon the multilayer chip 100a illustrated in FIG. 2 may be provided on the device and chip area A3. The die pad may be electrically connected to the common drain terminal of the dual FET chip 110 for configuring the multilayer chip 100a, and may be exposed in a subsequent packaging process to serve as an external connection terminal and to improve heat radiation properties. As another example, instead of the multilayer chip 100a, the flip chip 100b including the protection IC and the FETs described above in relation to FIG. 3 may be provided on the device and chip area A3.

A PTC structure 350 is provided on the PTC structure area A4. The PTC structure 350 includes a PTC device 310, and first and second metal layers 320 and 330 respectively coupled to two sides of the PTC device 310. The PTC device 310 may be produced by, for example, dispersing conductive particles in a crystalline polymer. Accordingly, the PTC device 310 serves as a current path between the first and second metal layers 320 and 330 at a predetermined temperature or below. However, if overcurrent occurs and the temperature is increased above the predetermined temperature, the crystalline polymer expands, the conductive particles dispersed in the crystalline polymer are disconnected from each other, and thus a resistance value is rapidly increased. Therefore, the current flow between the first and second metal layers 320 and 330 is blocked or reduced. Since the current flow may be blocked by the PTC device 310 as described above, the PTC device 310 serves as a safety device for preventing battery rupture. If the PTC device 310 is cooled below the predetermined temperature, the crystalline polymer contracts, the conductive particles recover the connections therebetween, and thus the current appropriately flows through the PTC device 310.

In the device and chip area A3 and the PTC structure area A4, the lead frame 50 may include a plurality of leads spaced apart from each other. The PTC structure 350 and/or the passive device 130 may be provided to interconnect at least some of the leads spaced apart from each other. For example, the first and second metal layers 320 and 330 of the PTC structure 350 may be respectively mounted on the leads spaced apart from each other. The multilayer chip 100a or the flip chip 100b including the protection IC and the FETs may also be provided to interconnect at least some of the leads spaced apart from each other. Furthermore, an electrical connection member 220 may electrically interconnect any two selected from the group consisting of the protection IC, the FETs (e.g., the multilayer chip 100a or the flip chip 100b including the protection IC and the FETs), and the mounting leads. The electrical connection member 220 may include a bonding wire or bonding ribbon. As such, the battery protection circuit module package according to an embodiment of the present invention may configure a battery protection circuit without using a printed circuit board (PCB).

FIG. 5 is a conceptual view of a battery protection circuit module package 300 according to an embodiment of the present invention.

Referring to FIG. 5, the battery protection circuit module package 300 is implemented by encapsulating the battery protection circuit devices 100a, 100b, 130, and 350 of the protection circuit structure 200a illustrated in FIG. 4, using an encapsulant 250 to expose the first and second internal connection terminal leads B+ and B− of the lead frame 50. In the battery protection circuit module package 300 according to an embodiment of the present invention, the PTC structure 350 mounted on the lead frame 50 is encapsulated with and thus embedded in the encapsulant 250.

Although the battery protection circuit module package 300 according to an embodiment of the present invention includes the lead frame 50 having a plurality of mounting leads spaced apart from each other, since a battery protection circuit is configured by providing the electrical connection member 220 such as a bonding wire or bonding ribbon on the lead frame 50, a process for designing and manufacturing the lead frame 50 for configuring the battery protection circuit may be simplified. If the electrical connection member 220 is not employed to configure the battery protection circuit in embodiments of the present invention, the configuration of the leads of the lead frame 50 may be very complicated and thus the lead frame 50 may not be appropriately and efficiently provided.

In the battery protection circuit module package 300 according to an embodiment of the present invention, a protection IC chip, an FET chip, or the multilayer chip 100a or the flip chip 100b including the protection IC and the FETs may not be inserted and fixed into the lead frame 50 in the form of a semiconductor package but may be mounted and fixed onto at least a part of the surface of the lead frame 50 using surface mounting technology in the form of a chip die not encapsulated with an encapsulant but sawed on a wafer. Herein, the chip die refers to an individual structure not encapsulated with an encapsulant but implemented by performing a sawing process on a wafer having an array of a plurality of structures (e.g., the protection IC chip and the FET chip) thereon. That is, when at least one selected from the group consisting of the protection IC chip, the FET chip, or the multilayer chip 100a or the flip chip 100b including the protection IC and the FETs are mounted on the lead frame 50, since the protection IC chip, the FET chip, or the multilayer chip 100a or the flip chip 100b including the protection IC and the FETs is mounted in non-encapsulated state and then is encapsulated with the encapsulant 250, only one encapsulation process is necessary to implement the battery protection circuit module package 300. On the contrary, when the protection IC chip, the FET chip, or the multilayer chip 100a or the flip chip 100b including the protection IC and the FETs is inserted and fixed or mounted into a PCB, since each component initially requires a molding process and then additionally requires another molding process after being fixed or mounted into the PCB, a manufacturing process is complicated and a manufacturing cost is high.

FIGS. 6 and 7 are perspective views showing that internal connection terminal leads 51 are folded in the battery protection circuit module package 300 according to an embodiment of the present invention. The internal connection terminal leads 51 include the first internal connection terminal lead B+ and/or the second internal connection terminal lead B−.

Referring to FIGS. 5 to 7, in the battery protection circuit module package 300 according to an embodiment of the present invention, each of the first and second internal connection terminal leads B+ and B− may be folded about a predetermined virtual axis located in the first and second internal connection terminal leads B+ and B−. For example, the internal connection terminal leads 51 may be folded about a predetermined virtual axis (e.g., a virtual axis parallel to the X axis) located in the internal connection terminal leads 51 in such a manner that first parts 51a of the internal connection terminal leads 51 and second parts 51b of the internal connection terminal leads 51 contact or face each other. Although FIGS. 6 and 7 illustrate that the second parts 51b of the internal connection terminal leads 51 are bent by 90° to form a right angle with the first parts 51a, the second parts 51b of the internal connection terminal leads 51 may be bent by 180° and folded to contact or face the first parts 51a. The second parts 51b of the internal connection terminal leads 51 may be bent by, for example, 90° to form a right angle with the first parts 51a when the battery protection circuit module package 300 is actually provided as a product, and then may be additionally bent by 90° and folded by a user to contact or face the first parts 51a.

Each of the first and second internal connection terminal leads B+ and B− may include a slit S (see FIG. 5) provided on the folding axis in such a manner that each of the first and second internal connection terminal leads B+ and B− is foldable. The first and second internal connection terminal leads B+ and B− may be easily bent and folded using the slits S provided in the first and second internal connection terminal leads B+ and B−.

A description is now given of a battery protection circuit module package assembly and a battery pack which are implemented using the above-described battery protection circuit module package 300. Initially, a battery protection circuit module package assembly and a battery pack according to a first embodiment is now described with reference to FIGS. 8 to 18.

For convenience, a battery protection circuit module package assembly described in this specification refers to a structure including a flexible printed circuit board (FPCB) and/or a connector in addition to the above-described battery protection circuit module package 300. Accordingly, the battery protection circuit module package assembly described in this specification may be understood as a battery protection circuit module package in a broad sense.

Battery Protection Circuit Module Package Assembly

FIGS. 8 and 9 are perspective views of a battery protection circuit module package assembly 600 according to another embodiment of the present invention.

Referring to FIGS. 8 and 9, the battery protection circuit module package assembly 600 according to another embodiment of the present invention includes the battery protection circuit module package 300 illustrated in FIGS. 6 and 7, an FPCB 400 coupled and electrically connected to the battery protection circuit module package 300, and a connector 500 coupled and electrically connected to the FPCB 400.

The lead frame 50 of the battery protection circuit module package 300 (e.g., the first to third external connection terminal leads P+, TH, and P− of the battery protection circuit module package 300) is coupled and electrically connected to one end 440 of the FPCB 400 using at least one method selected from the group consisting of laser welding, resistance welding, soldering, conductive adhesive, and conductive tape. FIG. 8 illustrates soldering as an example. The other end 460 of the FPCB 400 extends from the one end 440 of the FPCB 400 in a direction parallel to a length direction of the battery protection circuit module package 300 (e.g., the X direction of FIG. 8) and away from the battery protection circuit module package 300. Conductive pads to be coupled to the connector 500 are provided on the other end 460 of the FPCB 400.

The connector 500 includes a connector socket 520 and connector wiring 540. A structure connectable to a charger for charging and connectable to an electronic device (e.g., a mobile device) operating by battery power, for discharging may be inserted into the connector socket 520. The connector wiring 540 is used for electrical connection from the FPCB 400 to the connector socket 520, and may include a plurality of conductive cores 560 covered with an insulator. The conductive pads provided on the other end 460 of the FPCB 400 are coupled and electrically connected to the conductive cores 560 of the connector 500 using at least one method selected from the group consisting of laser welding, resistance welding, soldering, conductive adhesive, and conductive tape. The connector wiring 540 of the connector 500 extends in a direction (e.g., the −Y direction of FIG. 8) perpendicular to a length direction of the FPCB 400 (e.g., the X direction of FIG. 8) and away from the battery protection circuit module package 300 and is connected to the connector socket 520.

The step for coupling and electrically connecting the one end 440 of the FPCB 400 to the lead frame 50 and the step for coupling and electrically connecting the connector 500 to the other end 460 of the FPCB 400 may be simultaneously performed in a single process using a conventional process and conventional equipment and using at least one method selected from the group consisting of laser welding, resistance welding, soldering, conductive adhesive, and conductive tape.

For convenience, FIGS. 8 and 9 illustrate that the second parts 51b of the first and second internal connection terminal leads B+ and B− are bent by 90° to form a right angle with the first parts 51a. Furthermore, the second parts 51b of the first and second internal connection terminal leads B+ and B− may be bent by 180° and folded to contact or face the first parts 51a. The second parts 51b of the first and second internal connection terminal leads B+ and B− may be bent by, for example, 90° to form a right angle with the first parts 51a when the battery protection circuit module package assembly 600 is actually provided as a product, and then may be additionally bent by 90° and folded by a user to contact or face the first parts 51a.

Battery Pack

FIGS. 10 to 16 are perspective views showing a method of manufacturing a battery pack 800 according to still another embodiment of the present invention.

Initially, referring to FIG. 10, a battery cell 700 having a pair of electrode tabs 720 protruding therefrom is provided. The battery cell 700 is, for example, a battery cell used as a secondary battery, and may be a lithium polymer battery cell which currently attracts attention. The lithium polymer battery is produced in a pouched type having flexibility, and thus has a relatively flexible shape. In addition, the lithium polymer battery is safe and light and thus may be used in slim and light portable electronic devices. The battery cell 700 of the secondary battery may include a battery and a case for providing a space to accommodate the battery. The battery is similar to winding jelly and thus is also called a jelly roll. The jelly roll may be provided in the form of, for example, a stack of multiple electrode plates, and positive and negative plates may be alternately stacked on one another as the electrode plates. Furthermore, a separator may be inserted between the positive and negative plates. The electrode tabs 720 including a positive tap 720a and a negative tap 720b protrude from a side surface of the battery of the battery cell 700, and are electrically connected to the electrode plates. The electrode tabs 720 including the positive tap 720a and the negative tap 720b may be implemented using a tap cutting process. A protection member 710 may be configured to protect connection parts of the electrode tabs 720 and the electrode plates with an appropriate mechanical strength.

Referring to FIG. 11, tesa tape 740 may be adhered onto at least a part of the side surface of the battery cell 700 having the electrode tabs 720 protruding therefrom, and a bottom surface of the bare cell 700 connected thereto. The tesa tape 740 may be double-sided adhesive tape.

Referring to FIGS. 12 and 13, internal connection terminal leads of the above-described battery protection circuit module package 300 are provided to align with the electrode tabs 720. The first parts 51a of the internal connection terminal leads are initially provided to contact bottom surfaces of the electrode tabs 720 and then the second parts 51b of the internal connection terminal leads are bent by, for example, 90° in a direction toward the battery cell 700 to face the first parts 51a, thereby folding the internal connection terminal leads. Accordingly, parts of the electrode tabs 720 are intervened between the first parts 51a and the second parts 51b of the folded internal connection terminal leads. The first parts 51a and the second parts 51b of the internal connection terminal leads contacting the electrode tabs 720 may be coupled to each other along the contact surfaces using at least one method selected from the group consisting of laser welding, resistance welding, soldering, conductive adhesive, and conductive tape.

Referring to FIG. 14, the FPCB 400 is folded in a direction toward the battery cell 700 (e.g., the Y direction of FIG. 14) in such a manner that the connector socket 520 of the connector 500 overlaps with the battery cell 700. In this case, the folding axis may be parallel to a length direction of the FPCB 400 (e.g., the X direction of FIG. 14). One surface of the FPCB 400 illustrated in FIG. 13 is a surface coupled to the connector 500, and another surface of the FPCB 400 illustrated in FIG. 14 is opposite to the one surface and is shown because the FPCB 400 is folded. Since the FPCB 400 is folded, the connector socket 520 is located under the bottom surface of the battery cell 700.

Referring to FIG. 15, the electrode tabs 720 are bent in a direction toward the battery cell 700 in such a manner that the connector socket 520 is provided in a direction protruding from the battery cell 700 (e.g., the −Y direction of FIG. 14). In this case, the other surface of the FPCB 400 opposite to the one surface of the FPCB 400 coupled to the connector 500 may be coupled and fixed to the tesa tape 740 adhered to the battery cell 700.

The step for folding the FPCB 400 toward the battery cell 700 in FIG. 14 and the step for bending the electrode tabs 720 toward the battery cell 700 in FIG. 15 may be sequentially performed without using additional equipment. According to a modified embodiment, the above steps may be performed in reverse order or at the same time.

By folding the FPCB 400 as illustrated in FIG. 14 and bending the electrode tabs 720 as illustrated in FIG. 15, the battery protection circuit module package 300 is provided closer to the battery cell 700 in the battery pack 800 according to another embodiment of the present invention.

FIG. 17 is a cross-sectional view cut along line A-A of the battery pack 800 of FIG. 15, and FIG. 18 is a cross-sectional view cut along line B-B of the battery pack 800 of FIG. 15.

Referring to FIG. 17, in a partial cross section of the battery pack 800 cut along line A-A of FIG. 15, the FPCB 400, and the folded first internal connection terminal leads 51a and 51b having the positive tap 720a intervened therebetween are sequentially provided on the protection member 710 along a side wall of the battery cell 700 corresponding to the positive tap 720a, e.g., along the Z direction. The positive tap 720a protrudes from the battery cell 700, extends along the side wall of the battery cell 700, and further extends to the space between the folded first internal connection terminal leads 51a and 51b.

Referring to FIG. 18, in a partial cross section of the battery pack 800 cut along line B-B of FIG. 15, the folded second internal connection terminal leads 51a and 51b having the negative tap 720b intervened therebetween are sequentially provided on the protection member 710 along a side wall of the battery cell 700 corresponding to the negative tap 720b, e.g., along the Z direction. The negative tap 720b protrudes from the battery cell 700, extends along the side wall of the battery cell 700, and further extends to the space between the folded second internal connection terminal leads 51a and 51b.

Referring to FIGS. 15 and 16, a frame 920 surrounding the battery cell 700 may be provided to encapsulate the battery protection circuit module package 300 and the FPCB 400 and to expose only a part of the connector 500. The frame 920 may be implemented using a taping process. Alternatively, the frame 920 may be understood as a housing surrounding the battery cell 700.

Subsequently, a battery protection circuit module package assembly and a battery pack according to a second embodiment is now described with reference to FIGS. 19 to 26.

Battery Protection Circuit Module Package Assembly

FIG. 19 is a plan view of an FPCB 400 for configuring a battery protection circuit module package assembly 600 according to still another embodiment of the present invention, and FIG. 20 is a perspective view of the battery protection circuit module package assembly 600 according to still another embodiment of the present invention.

Referring to FIGS. 19 and 20, the battery protection circuit module package assembly 600 according to still another embodiment of the present invention includes the battery protection circuit module package 300 illustrated in FIGS. 6 and 7, and the FPCB 400 coupled and electrically connected to the battery protection circuit module package 300.

The lead frame 50 of the battery protection circuit module package 300 (e.g., the first to third external connection terminal leads P+, TH, and P− of the battery protection circuit module package 300) may be coupled and electrically connected to a first conductive terminal 450 provided on one end 440 of the FPCB 400 using at least one method selected from the group consisting of laser welding, resistance welding, soldering, conductive adhesive, and conductive tape. FIG. 20 illustrates soldering as an example. The other end 460 of the FPCB 400 may extend, for example, in a direction parallel to a width direction of the battery protection circuit module package 300 (e.g., the −Y direction of FIG. 20) and away from the battery protection circuit module package 300. The other end 460 of the FPCB 400 may expose a second conductive terminal 470 configured to be directly and electrically connected to a main board 580 (see FIG. 24). Herein, the main board 580 may include a main board of an electronic device connected to a battery pack 800 (see FIG. 24) to receive power supplied from the battery pack 800 or to supply power to the battery pack 800. The other end 460 of the FPCB 400 may not be electrically connected to the main board 580 by intervening the connector 500 therebetween as illustrated in FIG. 8, but the second conductive terminal 470 exposed on the other end 460 of the FPCB 400 may directly contact and be electrically connected to circuit wiring (not shown) of the main board 580. The FPCB 400 further includes a resin part 420 having flexibility, and the first conductive terminal 450 provided on the one end 440 and the second conductive terminal 470 provided on the other end 460 may be electrically connected to each other by being buried in the resin part 420 or using a wiring pattern (not shown) provided on the surface of the resin part 420.

For convenience, FIGS. 8 and 9 illustrate that the second parts 51b of the first and second internal connection terminal leads B+ and B− are bent by 90° to form a right angle with the first parts 51a. Furthermore, the second parts 51b of the first and second internal connection terminal leads B+ and B− may be bent by 180° and folded to contact or face the first parts 51a. The second parts 51b of the first and second internal connection terminal leads B+ and B− may not be bent to lie in the same plane as the first parts 51a or may be bent by, for example, 90° to form a right angle with the first parts 51a when the battery protection circuit module package assembly 600 is actually provided as a product. A user of the product may bend the second parts 51b of the first and second internal connection terminal leads B+ and B− by 90° or 180° and fold the same to contact or face the first parts 51a.

Battery Pack

FIGS. 21 to 23 are perspective views showing a method of manufacturing a battery pack 800 according to still another embodiment of the present invention, FIG. 24 is a perspective view showing that the battery pack 800 is coupled to the main board 580 of an electronic device, according to still another embodiment of the present invention, and FIGS. 25 and 26 are perspective views showing a process for coupling the battery pack 800 to the main board 580 of the electronic device, according to still another embodiment of the present invention.

Initially, as described above in relation to FIG. 10, a battery cell 700 having a pair of electrode tabs 720 protruding therefrom is provided. In addition, as described above in relation to FIG. 11, tesa tape 740 may be adhered onto at least a part of a side surface of the battery cell 700 having the electrode tabs 720 protruding therefrom, and a bottom surface of the bare cell 700 connected thereto. The tesa tape 740 may be double-sided adhesive tape.

Referring to FIG. 21, internal connection terminal leads of the battery protection circuit module package 300 of the above-described battery protection circuit module package assembly 600 are provided to align with the electrode tabs 720. The first parts 51*a* of the internal connection terminal leads are initially provided to contact top surfaces or bottom surfaces of the electrode tabs 720 and then the second parts 51*b* of the internal connection terminal leads are bent by, for example, 90° in a direction toward the battery cell 700 to face the first parts 51*a*, thereby folding the internal connection terminal leads. Accordingly, parts of the electrode tabs 720 are intervened between the first parts 51*a* and the second parts 51*b* of the folded internal connection terminal leads. The first parts 51*a* and the second parts 51*b* of the internal connection terminal leads contacting the electrode tabs 720 may be coupled to each other along the contact surfaces using at least one method selected from the group consisting of laser welding, resistance welding, soldering, conductive adhesive, and conductive tape.

Referring to FIG. 22, the resin part 420 of the FPCB 400 of the battery protection circuit module package assembly 600 may be folded about a predetermined axis parallel to a length direction of the battery protection circuit module package 300 (e.g., the X direction of FIG. 22). One surface of the FPCB 400 illustrated in FIG. 13 is a surface coupled to the connector 500, and another surface of the FPCB 400 illustrated in FIG. 14 is opposite to the one surface and is shown because the FPCB 400 is folded. Since the FPCB 400 is folded, the connector socket 520 is located under the bottom surface of the battery cell 700. Accordingly, as illustrated in a magnified part, at least a part of the resin part 420 of the FPCB 400 may be folded about the axis parallel to the length direction, and thus the battery protection circuit module package assembly 600 may be provided closer to the battery cell 700.

Referring to FIG. 23, parts of the electrode tabs 720*a* and 720*b* illustrated in FIG. 22 and exposed without being coupled to the internal connection terminal leads 51*a* and 51*b* may be bent and folded about a predetermined axis parallel to the length direction of the battery protection circuit module package 300 (e.g., the X direction of FIG. 22). Although the first parts 51*a* of the first and second internal connection terminal leads B+ and B− are exposed upward in the structure illustrated in FIG. 22, due to the above-described folding process, the second parts 51*b* of the first and second internal connection terminal leads B+ and B− are exposed upward in the structure illustrated in FIG. 23. In addition, due to the above-described folding process, the battery protection circuit module package assembly 600 may be provided closer to the battery cell 700 in the battery pack 800.

Referring to FIGS. 24 to 26, in the battery pack 800 implemented in FIG. 23, the second conductive terminal 470 provided on the other end 460 of the FPCB 400 may be directly and electrically connected to the main board 580. Herein, the main board 580 may include a main board of an electronic device (e.g., a smartphone, a mobile phone, a smartpad, or a tablet computer) electrically connected to the battery pack 800 to receive power supplied from the battery pack 800 or to supply power to the battery pack 800. The other end 460 of the FPCB 400 may not be electrically connected to the main board 580 by intervening the connector 500 therebetween as illustrated in FIG. 8, but the second conductive terminal 470 exposed on the other end 460 of the FPCB 400 may directly contact and be electrically connected to circuit wiring (not shown) of the main board 580.

To allow the second conductive terminal 470 to be directly and electrically connected to the main board 580, the main board 580 may include a housing 584 having a space 585 into which the other end 460 of the FPCB 400 is inserted, and the housing 584 may include a fixer 586 for fixing the other end 460 of the FPCB 400 inserted into the space 585. Specifically, referring to FIG. 25, when the fixer 586 of the housing 584 is open, the second conductive terminal 470 provided on the other end 460 of the FPCB 400 may be inserted into the space 585 of the housing 584. Subsequently, referring to FIG. 26, the fixer 586 of the housing 584 may be closed to fix the second conductive terminal 470 provided on the other end 460 of the FPCB 400 and inserted into the space 585 of the housing 584.

While the present invention has been particularly shown and described with reference to embodiments thereof, it will be understood by those of ordinary skill in the art that various changes in form and details may be made therein without departing from the spirit and scope of the present invention as defined by the following claims.

The invention claimed is:

1. A battery protection circuit module package comprising:
   a lead frame comprising a plurality of leads space apart from each other, and capable of being coupled and electrically connected to electrode tabs of a battery cell;
   battery protection circuit devices mounted on the lead frame and comprising a positive temperature coefficient (PTC) structure;
   an encapsulant for encapsulating the battery protection circuit devices to expose part of the lead frame;
   wherein the battery protection circuit devices further comprises a protection integrated circuit (IC), field effect transistors (FETs), and one or more passive devices,
   wherein the PTC structure and the passive devices are provided to interconnect at least some of the leads spaced apart from each other, and
   wherein the battery protection circuit module package further comprises an electrical connection member for electrically interconnecting any two selected from the group consisting of the protection IC, the FETs, and the leads, thereby configuring a battery protection circuit without using a printed circuit board (PCB).

2. The battery protection circuit module package of claim 1, wherein the PTC structure comprises
   a PTC device; and
   a first metal layer and a second metal layer respectively coupled to two sides of the PTC device,
   wherein the first and second metal layers are respectively mounted on the leads spaced apart from each other.

3. The battery protection circuit module package of claim 1, wherein the lead frame comprises:
   a first internal connection terminal lead and a second internal connection terminal lead respectively provided at two edges, exposed by the encapsulant, and capable of being coupled and electrically connected to the electrode tabs of the battery cell;
   external connection terminal leads provided between the first and second internal connection terminal leads and serving as a plurality of external connection terminals; and device mounting leads provided between the first and second internal connection terminal leads and having the battery protection circuit devices mounted thereon.

4. The battery protection circuit module package of claim 3, wherein each of the first and second internal connection terminal leads is foldable about a predetermined virtual axis located in the first or second internal connection terminal lead.

5. The battery protection circuit module package of claim 3, wherein each of the first and second internal connection terminal leads comprises a slit provided on a folding axis in such a manner that each of the first and second internal connection terminal leads is foldable.

6. The battery protection circuit module package of claim 1, wherein the lead frame is formed of nickel or a nickel-plated copper plate.

7. The battery protection circuit module package of claim 1, wherein the electrical connection member comprises a bonding wire or bonding ribbon.

8. The battery protection circuit module package of claim 1, wherein the protection IC and the FETs are not inserted and fixed into the lead frame in the form of a semiconductor package but are mounted and fixed onto at least a part of a surface of the lead frame using surface mounting technology in the form of a chip die not encapsulated with an encapsulant.

9. The battery protection circuit module package of claim 1, further comprising:
a flexible printed circuit board (FPCB) having one end coupled and electrically connected to the lead frame; and
a connector coupled and electrically connected to the other end of the FPCB.

10. The battery protection circuit module package of claim 9, wherein the external connection terminal leads are coupled to the FPCB or the FPCB is coupled to the connector using at least one method selected from the group consisting of laser welding, resistance welding, soldering, conductive adhesive, and conductive tape.

11. The battery protection circuit module package of claim 1, further comprising an FPCB having one end coupled and electrically connected to the lead frame, and the other end exposing a conductive terminal configured to be directly and electrically connected to a main board of an electronic device connectable to the battery pack.

* * * * *